United States Patent
Lin et al.

(10) Patent No.: US 8,148,223 B2
(45) Date of Patent: Apr. 3, 2012

(54) 1T MIM MEMORY FOR EMBEDDED RAM APPLICATION IN SOC

(75) Inventors: Yi-Ching Lin, Sunnyvale, CA (US);
Chun-Yao Chen, Hsinchu (TW);
Chen-Jong Wang, Hsinchu (TW);
Shou-Gwo Wuu, Hsinchu (TW); Chung S. Wang, Fremont, CA (US);
Chien-Hua Huang, Hsinchu (TW);
Kun-Lung Chen, Taipei (TW); Ping Yang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 836 days.

(21) Appl. No.: 11/437,673

(22) Filed: May 22, 2006

(65) Prior Publication Data

US 2007/0267674 A1      Nov. 22, 2007

(51) Int. Cl.
*H01L 21/8242* (2006.01)

(52) U.S. Cl. ........ 438/253; 438/244; 438/254; 438/397; 257/303; 257/308; 257/E21.619

(58) Field of Classification Search .................. 438/241, 438/244, 253, 221, 424, 425, 296, 254, 397, 438/398, 399; 257/300, E21.649, E21.646, 257/E21.651, 303, 306, 308, 309, 311
See application file for complete search history.

(56) References Cited

U.S. PATENT DOCUMENTS

| | | | |
|---|---|---|---|
| 5,656,852 A * | 8/1997 | Nishioka et al. | 257/632 |
| 6,661,051 B1 * | 12/2003 | Durcan et al. | 257/306 |
| 6,682,985 B2 * | 1/2004 | Yuzuriha et al. | 438/425 |
| 6,686,239 B2 | 2/2004 | Nam et al. | |
| 6,696,716 B2 * | 2/2004 | Basceri et al. | 257/301 |
| 6,720,232 B1 * | 4/2004 | Tu et al. | 438/396 |
| 6,734,060 B2 * | 5/2004 | Nakamura et al. | 438/253 |
| 6,893,937 B1 * | 5/2005 | Gu et al. | 438/424 |
| 6,903,398 B2 | 6/2005 | Yamamoto et al. | |
| 7,335,561 B2 * | 2/2008 | Sakai et al. | 438/275 |
| 2001/0050385 A1 | 12/2001 | Kotecki et al. | |
| 2004/0084709 A1 * | 5/2004 | Kim et al. | 257/306 |
| 2005/0082586 A1 | 4/2005 | Tu et al. | |
| 2005/0124132 A1 | 6/2005 | Tu | |
| 2005/0156216 A1 * | 7/2005 | Cross et al. | 257/295 |

FOREIGN PATENT DOCUMENTS

| | | |
|---|---|---|
| CN | 1437221 A | 8/2003 |
| TW | 522553 A | 3/2001 |

* cited by examiner

*Primary Examiner* — Julio J Maldonado
(74) *Attorney, Agent, or Firm* — Birch, Stewart, Kolasch & Birch, LLP

(57) ABSTRACT

Embedded memories. The devices include a substrate, a first dielectric layer, a second dielectric layer, a third dielectric layer, and a plurality of capacitors. The substrate comprises transistors. The first dielectric layer, embedding first and second conductive plugs electrically connecting the transistors therein, overlies the substrate. The second dielectric layer, comprising a plurality of capacitor openings exposing the first conductive plugs, overlies the first dielectric layer. The capacitors comprise a plurality of bottom plates, respectively disposed in the capacitor openings, electrically connecting the first conductive plugs, a plurality of capacitor dielectric layers respectively overlying the bottom plates, and a top plate, comprising a top plate opening, overlying the capacitor dielectric layers. The top plate opening exposes the second dielectric layer, and the top plate is shared by the capacitors.

23 Claims, 29 Drawing Sheets

1T MIM MEMORY FOR EMBEDDED RAM APPLICATION IN SOC

BACKGROUND

The invention relates to semiconductor technology, and more specifically to embedded memories.

Capacitors are elements that are used extensively in semiconductor devices for storing an electrical charge. Capacitors essentially comprise two conductive plates separated by a dielectric material. The capacitance, or amount of charge held by the capacitor per applied voltage, depends on a number of parameters such as the area of the plates, the distance between the plates, and the dielectric constant value for the dielectric material between the plates, for example. Capacitors are used in filters, analog-to-digital converters, memory devices, control applications, and many other types of semiconductor devices.

One type of capacitor is an MIM capacitor, which is frequently used in mixed signal devices and logic devices, such as embedded memories. MIM capacitors are used to store a charge in a variety of semiconductor devices. MIM capacitors are often used as a storage node in a memory device, for example. An MIM capacitor is typically formed horizontally on a semiconductor wafer, with two metal plates sandwiching a dielectric layer parallel to the wafer surface. Often, one of the metal plates is formed in a metallization layer or metal interconnect layer of a semiconductor device.

Conventionally, formation of an MIM capacitor requires three or more mask layers and complex processing, affecting throughput and process cost. This complex processing potentially induces more yield loss. Thus, embedded memories requiring less mask layers are desired.

SUMMARY

The invention provides embedded memories and methods for fabricating the same, requiring less mask layers, thus, reducing process cost and improving throughput.

The invention provides a semiconductor device comprising a substrate, an inter-layer dielectric layer, a plurality of bottom plates, a plurality of capacitor dielectric layers, and one shared top plate. The inter-layer dielectric layer overlies a substrate and comprises a plurality of capacitor openings therein. The bottom plates are respectively disposed in the capacitor openings. The capacitor dielectric layers are respectively disposed overlying the bottom plates. The shared top plate, comprising a top plate opening, is disposed overlying the capacitor dielectric layer.

The invention further provides an embedded memory comprising a substrate, a first dielectric layer, a second dielectric layer, and a plurality of capacitors. The substrate comprises first transistors in a cell array region and second transistors in a periphery region. The first dielectric layer, with embedded first and second conductive plugs electrically connecting the first transistors, overlies the substrate. The second dielectric layer, comprising a plurality of capacitor openings exposing the first conductive plugs, overlies the first dielectric layer. The capacitors are at least partially embedded in the capacitor openings. The capacitors comprise a plurality of bottom plates, a dielectric layer, and a top plate. The bottom plates are respectively disposed in the capacitor openings and electrically connect the first conductive plugs. The capacitor dielectric layer respectively overlies the bottom plates. The top plate, comprising a top plate opening, overlies the capacitor dielectric layers. The top plate opening exposes the second dielectric layer. The top plate is shared by the capacitors.

The invention further provides a method for fabricating an embedded memory. First, a substrate comprising a cell array region and a periphery region is provided. An isolation structure is then formed overlying the substrate to divide the cell array into a plurality of first active areas isolated by a first isolation area and divide the periphery region into a plurality of second active areas isolated by a second isolation area. Next, a plurality of first transistors are formed in the first active area and a plurality of second transistors are formed in the second active region. Next, a first dielectric layer is formed overlying the first and second transistors. Next, first and second conductive plugs, electrically connecting the first transistors, are embedded into the first dielectric layer. Next, a second dielectric layer is formed overlying the first dielectric layer. Next, the second dielectric layer is patterned to form a plurality of capacitor openings therein, exposing the first conductive plugs. Next, a first plate layer is conformally formed overlying the second dielectric layer. Next, the first plate layer beyond the capacitor opening is removed. Next, a capacitor dielectric layer is conformally formed overlying the second dielectric layer and the first plate layer in the first opening. Further, a second plate layer is conformally formed overlying the capacitor dielectric layer. Finally, the capacitor dielectric layer and the second plate layer are patterned to form a top plate opening exposing the second dielectric layer.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention can be more fully understood by reading the subsequent detailed description in conjunction with the examples and references made to the accompanying drawings, which are given by way of illustration only, and thus are not limitative of the invention, and wherein.

DESCRIPTION

The following embodiments are intended to illustrate the invention more fully without limiting the scope of the claims, since numerous modifications and variations will be apparent to those skilled in this art.

Figure 1A:
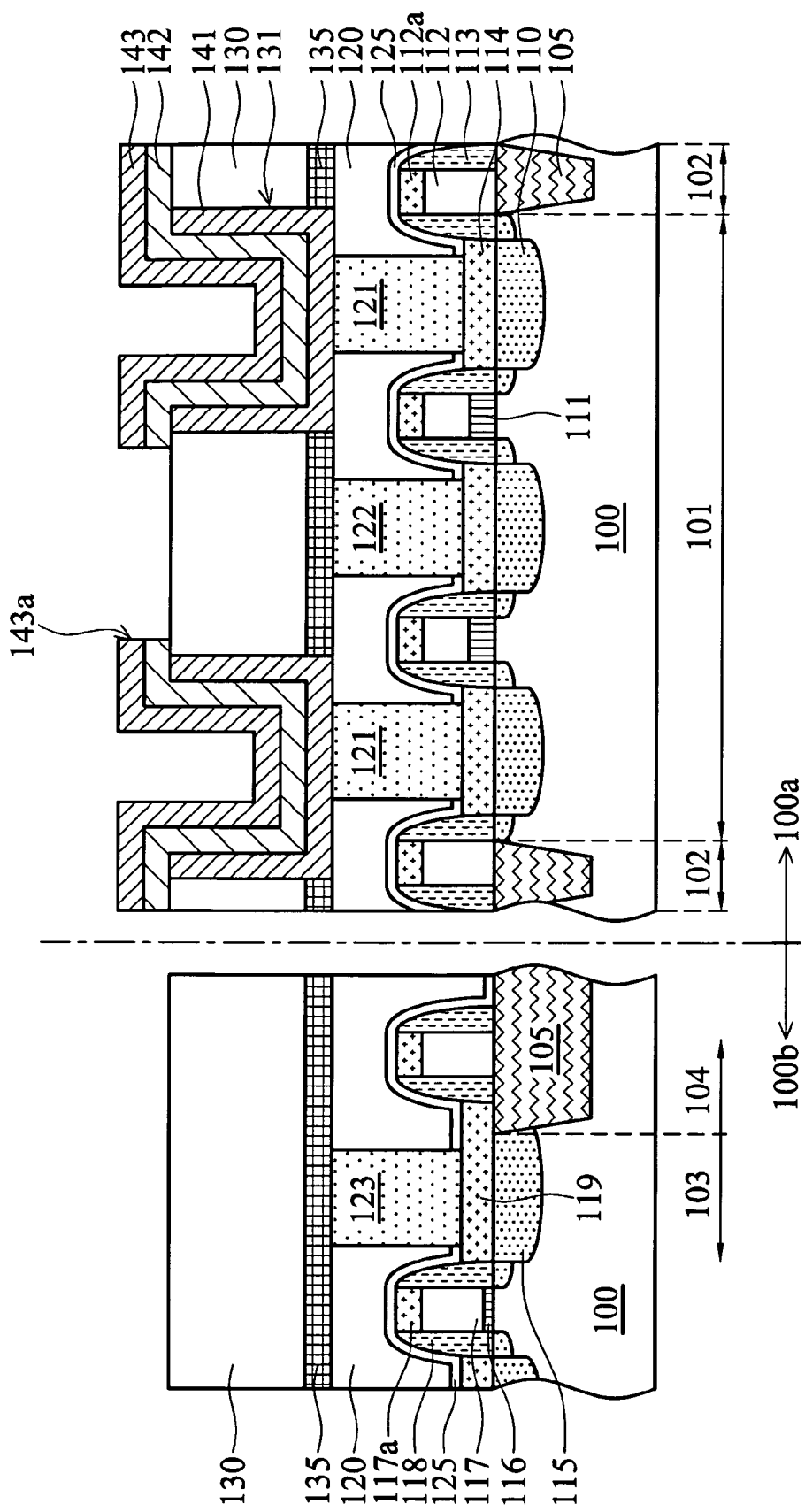
FIGS. 1A through 1D are cross-sections and a top view of preferred embodiments of embedded memories of the invention.

In FIG. 1A, a preferred embodiment of an embedded memory of the invention is shown. The embedded memory comprises a semiconductor overlying a cell array region 100a of a substrate 100. The substrate 100 comprises semiconductor materials such as silicon, germanium, silicon germanium, compound semiconductor, or other known semiconductor materials. The semiconductor device comprises a plurality of capacitors at least partially embedded in an inter-layer dielectric layer 130 overlying the substrate 100.

The inter-layer dielectric layer 130 may comprise organic dielectrics formed by spin-coating, silicon oxide, or oxide-based dielectrics such as BPSG (borophosphorosilicate glass), PSG (phosphosilicate glass), USG (undoped silicate glass), stack structure of USG/PSG/USG, combinations thereof, or other known dielectrics. In some cases, the inter-layer dielectric layer 130 comprises low-k dielectrics with a dielectric constant of 3.9 or below, and preferably below 3.0. A plurality of capacitor openings 131 are formed in the inter-layer dielectric layer 130. In this embodiment, the capacitor openings 131 are through the inter-layer dielectric layer 130 for electrically connecting the capacitors to underlying circuits. In some cases, the capacitor openings 131 may not be through the inter-layer dielectric layer 130. In this embodiment, every capacitor opening 131 embeds a capacitor. In some cases, at least one capacitor opening 131 may have a plurality of capacitors embedded therein. The aspect ratio of the capacitor openings 131 depends on the desire capacitance of the resulting capacitors. In general, the capacitance of the resulting capacitors increases as increase of the aspect ratio of the capacitor openings 131.

The capacitors comprise a plurality of bottom plates 141, a capacitor dielectric layer 142, and a shared top plate 143. The bottom plates 141 are respectively disposed in the capacitor openings 131. In this embodiment, the bottom plates 141 overlie sidewalls and bottoms of the capacitor openings 131. The bottom plates 141 may comprise TiN, TaN, or other conductive materials. The capacitor dielectric layer 142 overlies the bottom plates 141. The capacitor dielectric layer 142 may comprise high dielectric constant materials such as tantalum oxide, hafnium oxide, aluminum oxide, zirconium oxide, or other dielectric materials. The top plate 143 overlies the capacitor dielectric layer 142. The top plate 143 may comprise TiN, TaN, or other conductive materials. The top plate 143 comprises a top plate opening 143a exposing the inter-layer dielectric layer 130. In some embodiments, the top plate opening 143a provides space for formation of electrical connection between the underlying and overlying circuits without electrical connection to the top plate 143.

Figure 1B:
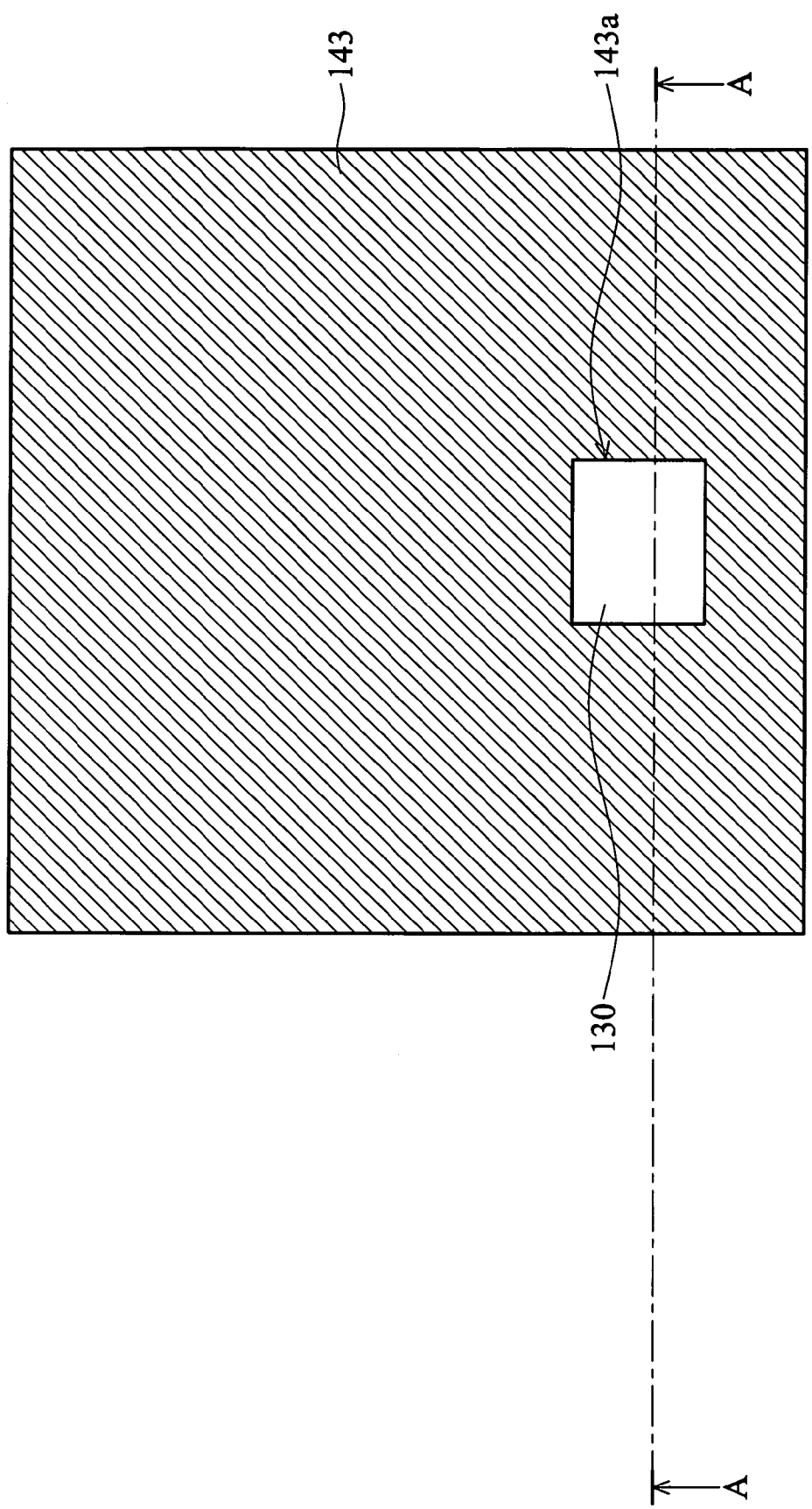

The top plate 143 is shared by a plurality of capacitors. In some cases, capacitors of one semiconductor chip share one top plate 143. In some cases, capacitors of one functional region of a semiconductor chip share one top plate 143. In FIG. 1A, the two illustrated capacitors share one top plate 143. The top view of the top plate 143 is shown in FIG. 1B and the cross-section view along AA line in FIG. 1B is the described semiconductor device. The top plate 143 is not divided into independent or isolated pieces. The top plate opening 143a is formed in the top plate 143. Note that the quantity and shape of the top plate opening 143a shown in FIG. 1B is an example, and is not intended to limit the scope of the invention. Those skilled in the art will recognize the possibility of using various quantities and shapes of openings to achieve the top plate opening 143a shown in FIG. 1B.

In FIG. 1A, the substrate 100 further comprises a periphery region 100b. The substrate 100 comprises first transistors in the cell array region and second transistors in the periphery region. In this embodiment, an isolation structure 105 is formed in the substrate 100, dividing the cell array region 100a into an active area 101 and an isolation area 102, and the periphery region 100b into an active area 103 and an isolation area 104. In this embodiment, the periphery region 100b belongs to a logic device and the cell array region 100a belongs to a memory device. In some cases, the periphery region may belong to an analogue device, a radio-frequency device, or other devices.

Figure 6:
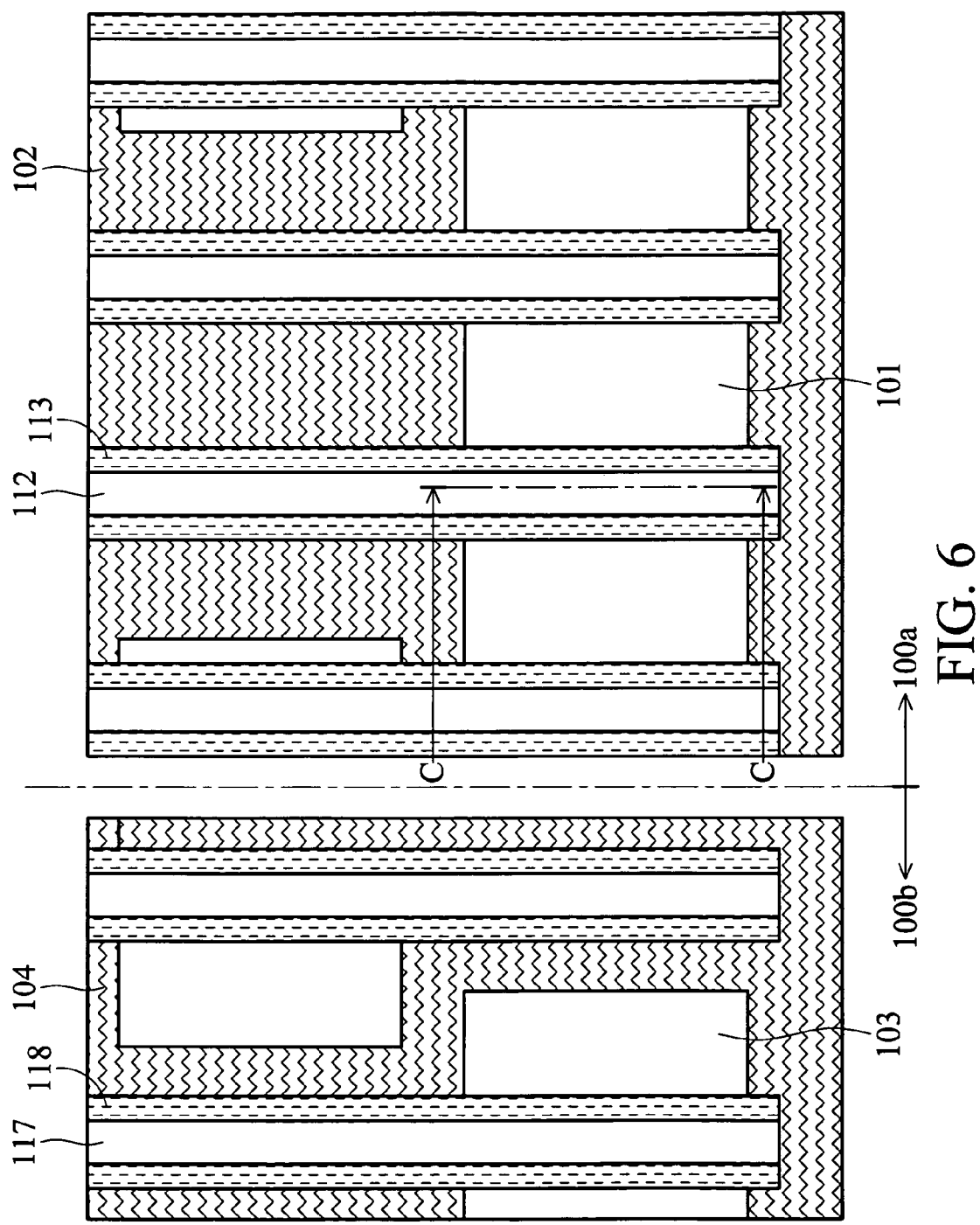
FIGS. 6, 7A, and 7B are a top view and cross-sections illustrating advantages of the modified embedded memories of the invention.

The first transistors comprise source/drain (S/D) regions 110, gate dielectric layers 111, gate electrodes 112, spacers 113, and optional silicide layers 114. The S/D regions 110 are embedded in the substrate 100 in the active area 101. The gate dielectric layers 111 overlie the substrate 100 and the gate electrodes 112 overlie the gate dielectric layers 111. The gate electrodes 112 may comprise doped polycrystalline silicon, metal, or other known conductive materials. In some cases, the gate electrodes 112 extends to both the active area 101 and isolation area 102 as shown in FIG. 6, a top view thereof. In this embodiment, the gate dielectric layers 111 comprise thermal oxides (formed by thermal oxidation), and thus, the gate dielectric layers 111 overlying the isolation structure 105 is too thin to be illustrated. In some cases, the gate dielectric layers 111 comprises nitrides, nitrified oxides, or known high-k (dielectric constant) dielectrics (such as hafnium oxide or other high-k dielectrics), and is formed by at least one of known CVD methods. The spacers 113 are disposed overlying sidewalls of the gate electrodes 112. The optional silicide layers 114 overlie the S/D regions 110 for reducing contact resistance between the S/D regions 110 and the conductive plug 121 or 122. When the gate electrodes 112 comprise doped polycrystalline silicon, silicide layers 112a are respectively formed on the top thereof during formation of the silicide layers 114. In some cases, the silicide layers 114 may be omitted. In other cases, the silicide layers 114 may be selectively formed overlying some or all of the S/D regions 110 for control of electrical performance of the embedded memory.

The second transistors comprise S/D regions 115, gate dielectric layers 116, gate electrodes 117, spacers 118, and optional silicide layers 119. In some cases, the silicide layers 119 may be omitted. In other cases, the silicide layers 119 may be selectively formed overlying some or all of the S/D regions 115 for control of electrical performance of the devices formed in the periphery region 100b. Details regarding the active area 103, isolation area 104, S/D regions 115, gate dielectric layers 116, gate electrodes 117, silicide layers 117a, spacers 118, and optional silicide layers 119 are the same as the described active area 101, isolation area 102, S/D regions 110, gate dielectric layers 111, gate electrodes 112, silicide layers 112a, spacers 113, and optional silicide layers 114, and thus, are omitted herefrom. In some cases, the silicide layers 119 are formed while the silicide layers 114 are not formed, or else, the silicide layers 114 are formed while the silicide layers 119 are not formed. In some cases, the silicide layers 114 and 119 may be selectively formed overlying some or all of the S/D regions 110 and 115 as required.

The thickness of the gate dielectric layers 111 depends on the desired leakage performance of the first transistors of the memory device, and thus, may be different from that of the gate dielectric layer 116. In this embodiment, the gate dielectric layer 111 is thicker than the gate dielectric layer 116.

The embedded memory comprises a first dielectric layer 120 overlying the substrate 100. The first dielectric layer 120 may comprise organic dielectrics formed by spin-coating, silicon oxide, or oxide-based dielectrics such as BPSG, PSG, USG, stack structure of USG/PSG/USG, combinations thereof, or other known dielectrics. In some cases, the first dielectric layer 120 comprises low-k dielectrics with a dielectric constant of 3.9 or below, and preferably below 3.0. In some cases, the first dielectric layer 120 further comprises an underlying etch stop layer 125 as shown in FIG. 1A. The first dielectric layer 120 embeds a plurality of conductive plugs 121 and a conductive plug 122 electrically connecting the first transistors. In this embodiment, the conductive plugs 121 and 122 electrically connect the S/D regions 110. In some cases, at least one of the conductive plugs 121 and 122 may electrically connect the gate electrode 112. The first dielectric layer 120 may further embed a conductive plug 123 electrically connecting the second transistor. In this embodiment, the conductive plug 123 electrically connects the S/D regions 115. In some cases, the conductive plug 123 may electrically connect the gate electrode 117. The conductive plugs 121 through 123 may comprise doped polycrystalline silicon, tungsten, aluminum, copper, combinations thereof, or other conductive materials.

The embedded memory comprises the described inter-layer dielectric layer 130 as a second dielectric layer overlying the first dielectric layer 120. The inter-layer dielectric layer 130 comprises a plurality of capacitor openings 131 at least partially embedding the capacitors as described. The bottom plates 141 respectively electrically connect the first conductive plugs 121. In this embodiment, the inter-layer dielectric layer 130 further comprises an optional underlying etch stop layer 135. In some cases, the etch stop layer 135 may be omitted.

The capacitance of the capacitors is preferably as large as 15 fF or less to provide a higher data charge/discharge rate to obtain higher speed performance of the memory device.

Figure 1C:
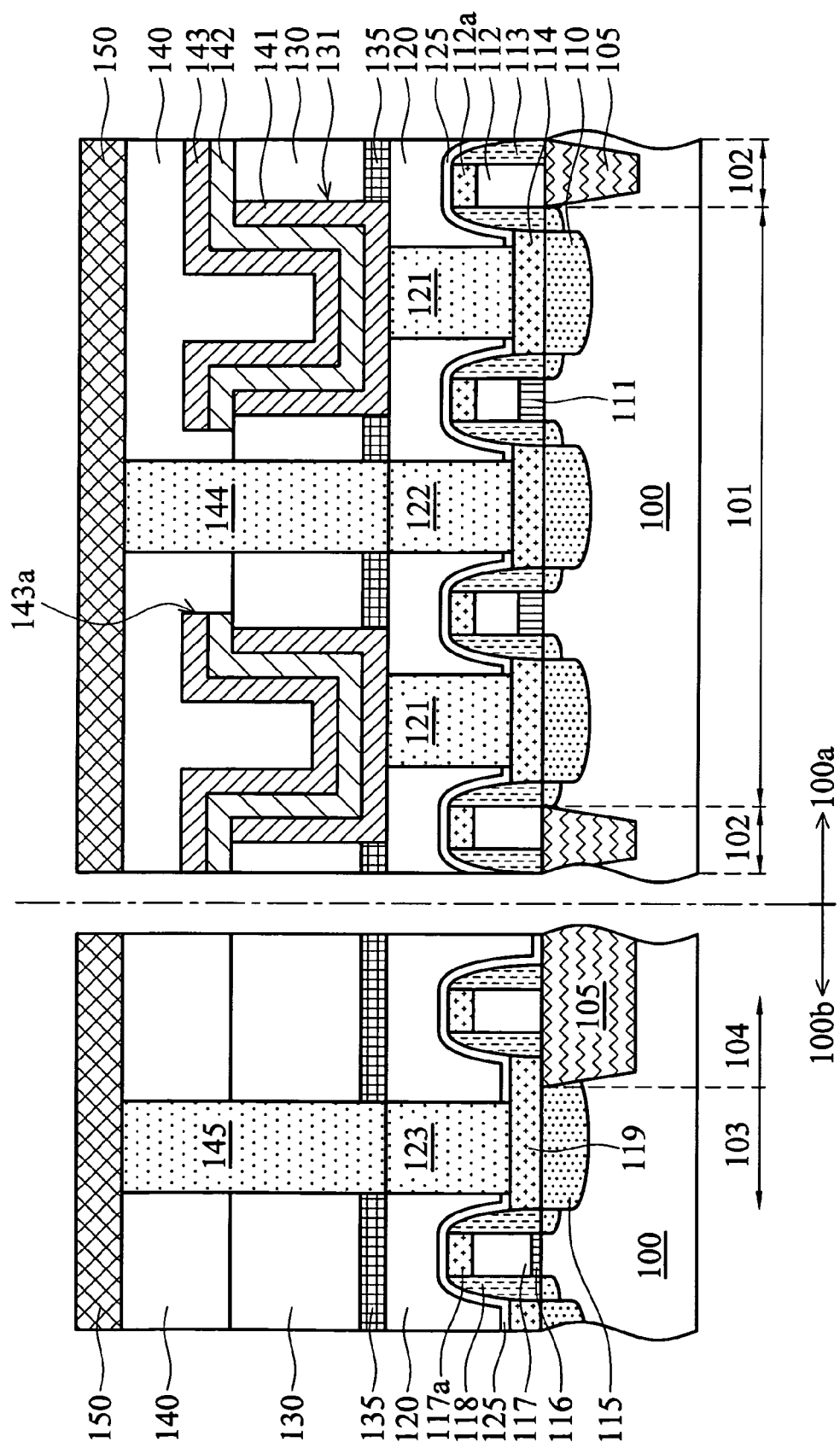

As shown in FIG. 1C, an interconnect structure may be formed in the embedded memory shown in FIG. 1A. In FIG. 1C, the embedded memory further comprises a third dielectric layer 140, a conductive plug 144, and a metal line 150.

The third dielectric layer 140 overlies the top plate 143 and the exposed inter-layer dielectric layer 130. The third dielectric layer 140 may comprise organic dielectrics formed by spin-coating, silicon oxide, or oxide-based dielectrics such as BPSG, PSG, USG, stack structure of USG/PSG/USG, combinations thereof, or other known dielectrics. In some cases, the third dielectric layer 140 comprises low-k dielectrics with dielectric constant of 3.9 or below, and preferably below 3.0.

A conductive plug 144 is embedded in the dielectric layers 130 and 140, electrically connecting the conductive plug 122. The aspect ratio of the conductive plug 144 is preferably as large as 12 or less for improving production yield of the embedded memory. When the conductive plug 144 is utilized for electrical connection between an interconnect layer and the first transistors, the conductive plug 144 and the top plate 143 are isolated by the third dielectric layer 140. In this embodiment, the conductive plug 144 extends through the top plate opening 143a and is isolated with the top plate 143 by the third dielectric layer 140.

In some cases, the embedded memory may comprise a conductive plug 145 embedded in the dielectric layers 130 and 140, electrically connecting the conductive plug 123. The aspect ratio of the conductive plug 145 is preferably as large as 12 or less for improving production yield of the embedded memory. The conductive plugs 144 and 145 may comprise doped polycrystalline silicon, tungsten, aluminum, copper, combinations thereof, or other conductive materials.

The metal line 150 of an interconnect layer overlies the third dielectric layer 140, electrically connecting the conductive plug 144. In this embodiment, the metal line 150 acts as a bit line and comprises as large as 64 bits or less, or alternatively, 32 bits or less thereon to reduce parasitical capacitance thereof, and thus, the embedded memory can provide higher speed performance than the commercial DRAM of 128 or 256 bits. Further, the metal line 150 may electrically connect at least one of the top plates 143 utilizing known interconnection techniques, and the connection structure therefor is omitted from this disclosure. In this embodiment, the embedded memory may comprise a normal cell array and redundant cell array (both not shown) in the cell array region 100a. An error correction code (ECC) algorithm can be utilized to fix memory failure bits due to defects to improve the process yield and product reliability.

Figure 1D:
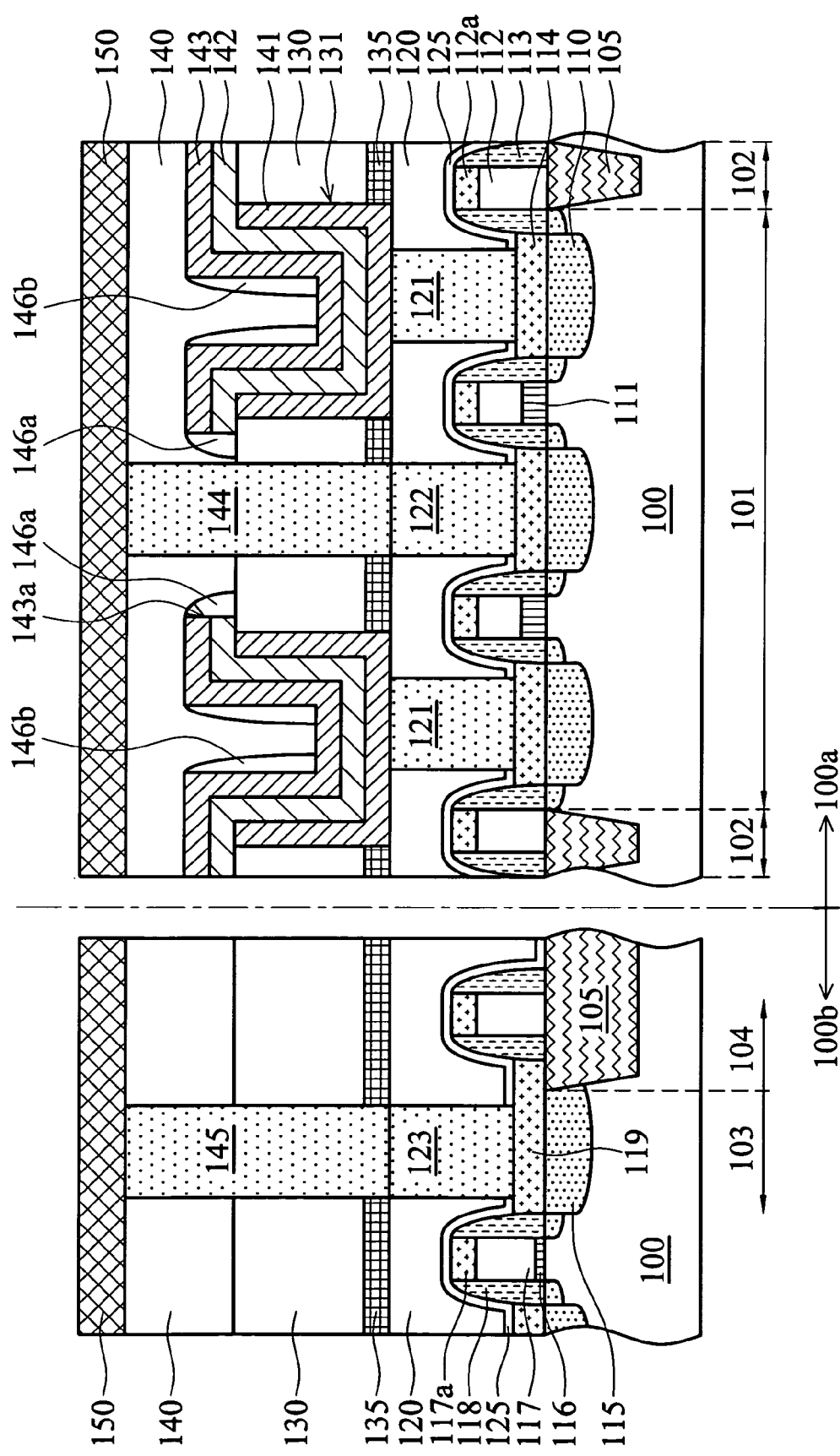

FIG. 1D shows another embodiment of the invention. Compared to FIG. 1C, the embedded memory shown in FIG. 1D further comprises an optional dielectric spacer 146a between the conductive plug 144 and the top plate 143. In this embodiment, the dielectric spacer 146a is disposed on a sidewall of the top plate 143 in the top plate opening 143a. In some cases, a dielectric spacer 146b of the same material with the dielectric spacer 146a may be disposed on the top plate 143 in a sidewall of the openings 131.

FIGS. 2A through 2M are cross-sections of fabrication methods of embedded memories of the invention.

Figure 2A:
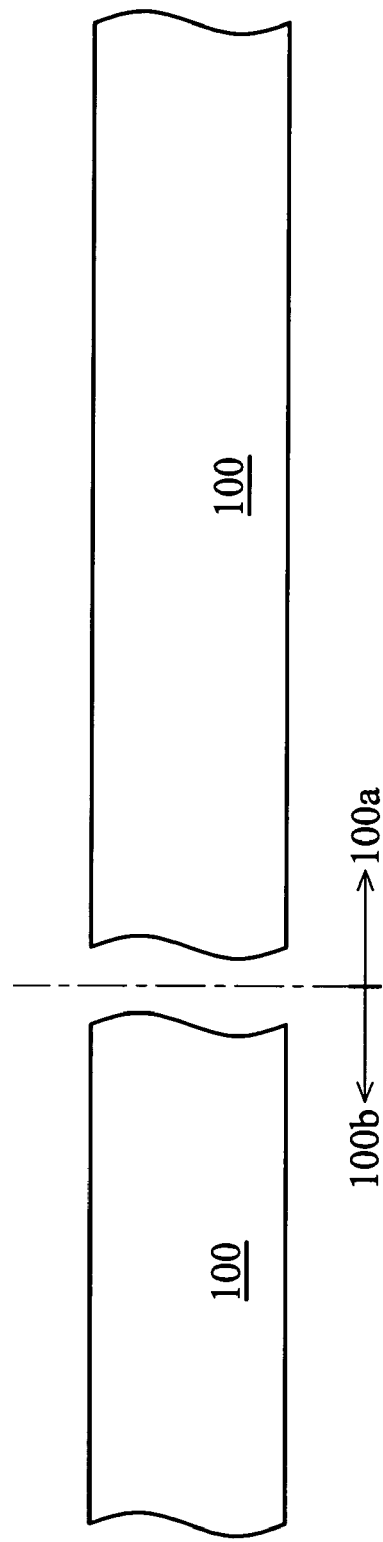
FIGS. 2A through 2M are cross-sections of fabrication methods of embedded memories of the invention.
Figure 2B:
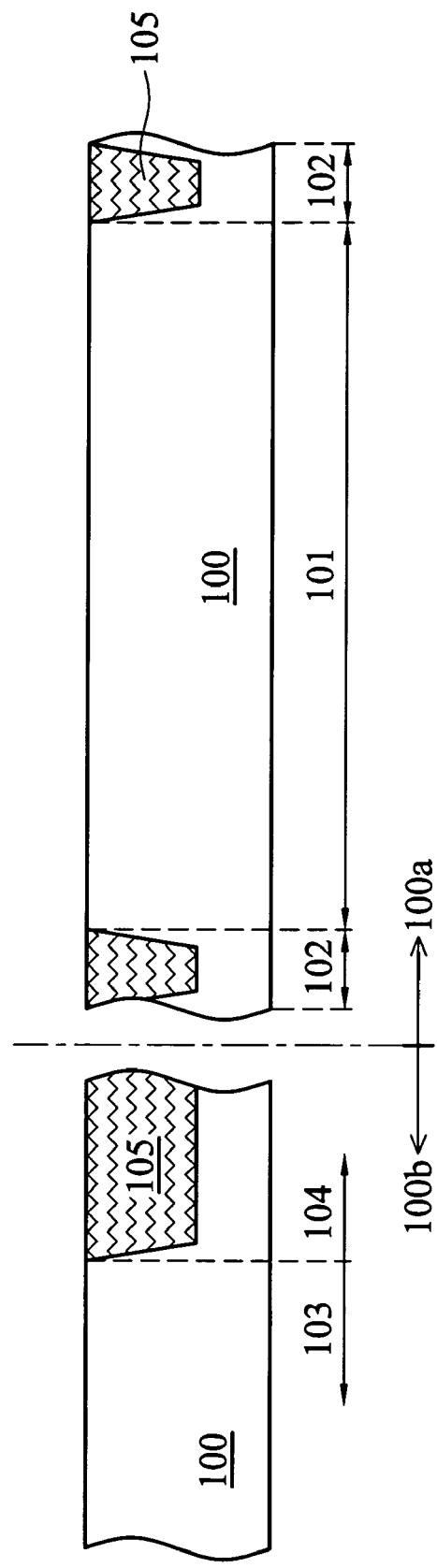
Figure 4:
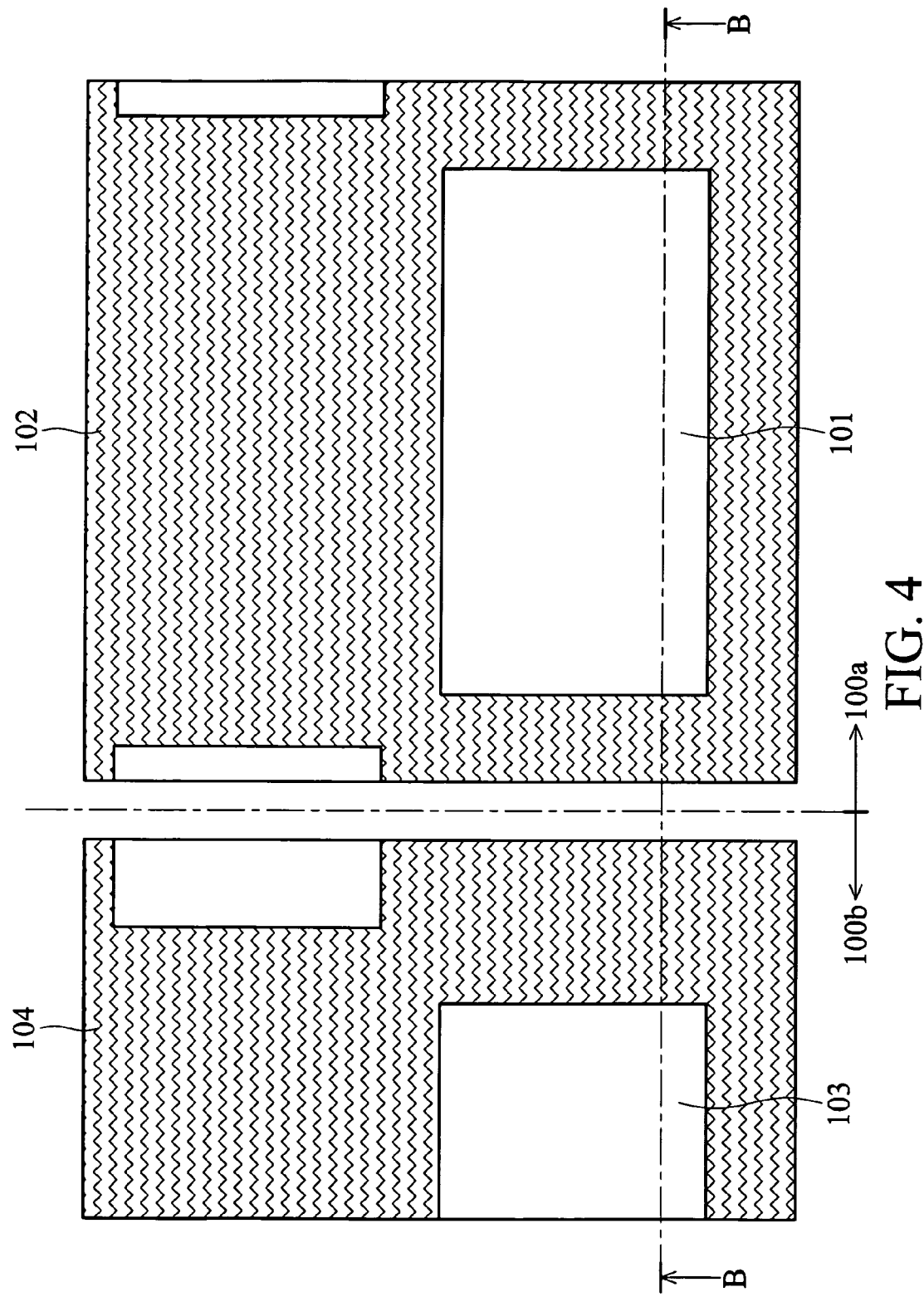
FIG. 4 is a top view of the device of FIG. 2B.

In FIG. 2A, first, the substrate 100 comprising the cell array region 100a and the periphery region 100b is provided. As shown in FIG. 2B, the isolation structure 105 is then formed in the substrate 100, dividing the cell array region 100a into a plurality first active areas 101 isolated by a first isolation area 102, and the periphery region 100b into a plurality of second active areas 103 isolated by a second isolation area 104. Top view of the devices in FIG. 2B is shown in FIG. 4, and cross-section along line BB is shown in FIG. 2B. The isolation structure 105 comprises field oxide, shallow trench isolation, combination thereof, or other isolation structures.

Figure 2C:
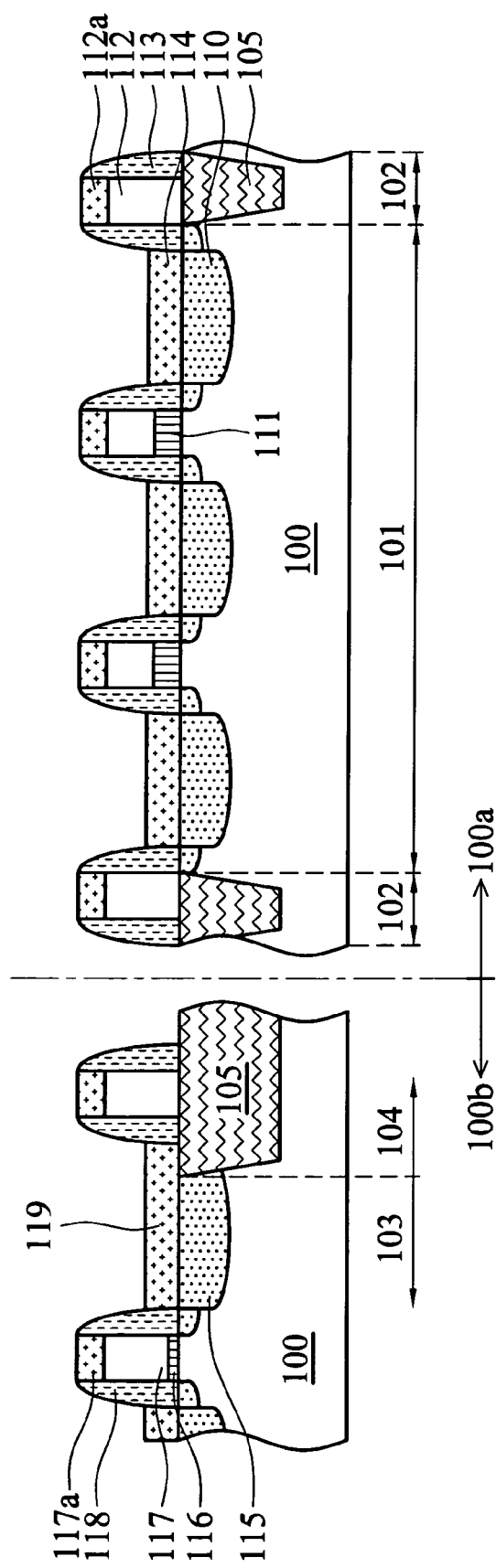

In FIG. 2C, a plurality of first and second transistors are formed in the first active area 101 and the second active area 103, respectively. Any known transistor formation processes may form the first and second transistors.

Figure 2D:
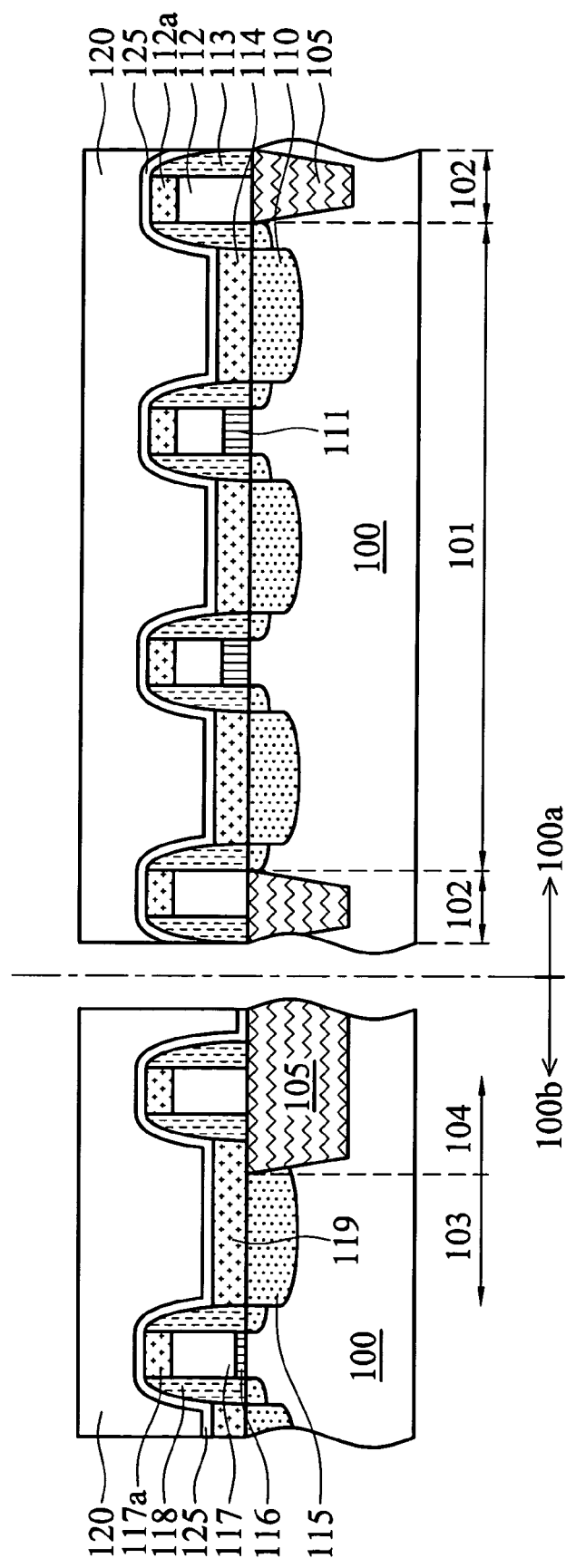

In FIG. 2D, the first dielectric layer 120 is formed overlying the first and second transistors, and is preferably followed by a planarization step utilizing CMP (chemical mechanical polish) or other techniques to planarize the first dielectric layer 120. The first dielectric layer 120 can be formed by CVD (such as HDPCVD, PECVD, APCVD, or other known CVD methods), spin-coating, or other methods. The first dielectric layer 120 optionally comprises an underlying etch stop layer 125.

Figure 2E:
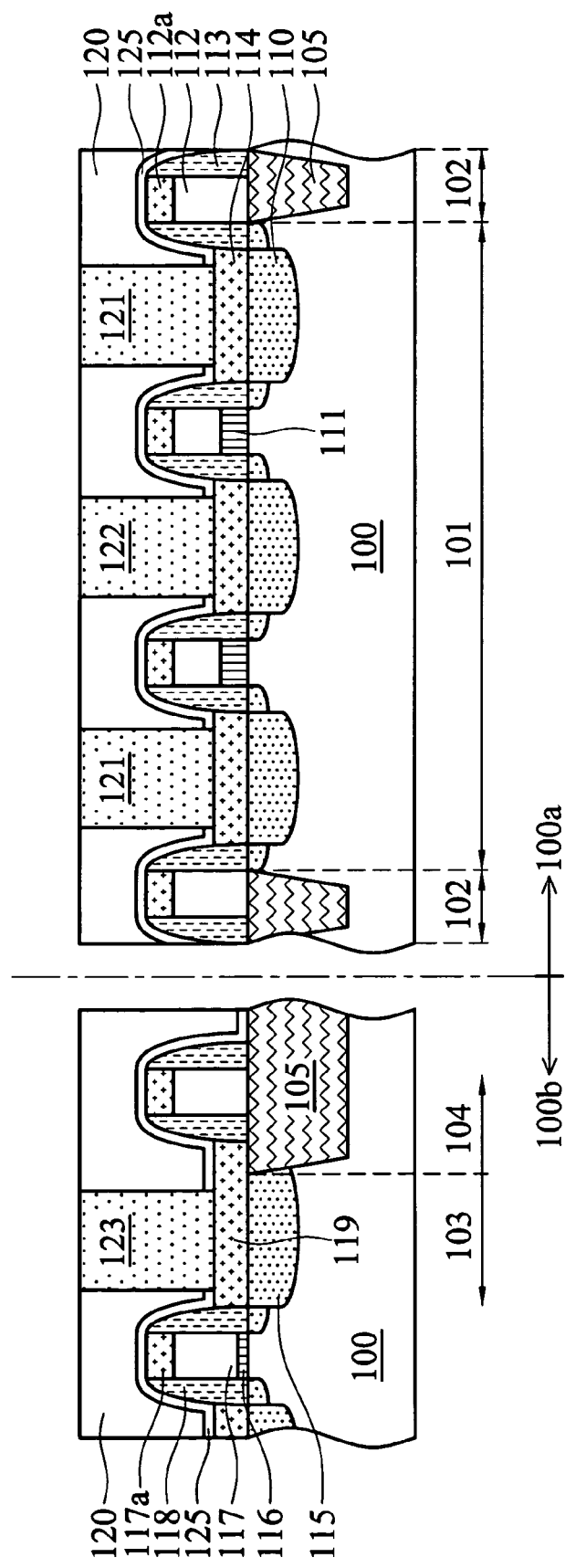

In FIG. 2E, the conductive plugs 121 and 122 are embedded in the first dielectric layer 120. In some cases, the conductive plug 123 may be simultaneously embedded in the first dielectric layer 120. For example, the first dielectric layer 120 can be patterned to form a plurality of openings exposing conductive parts of the first and second transistors, followed by filling conductive materials in the openings and preferably performing a planarization step utilizing CMP or other techniques to form the conductive plugs 121 and 122 electrically connecting the first transistors and the conductive plug 123 electrically connecting the second transistors. In this embodiment, the conductive parts are S/D regions 110 and 115. When the first dielectric layer 120 comprises the etch stop layer 125, the patterning thereof stops on the etch stop layer 125, followed by patterning the etch stop layer 125 to protect the underlying substrate 100 from damage due to patterning. The conductive materials can be filled by CVD, PVD, electroplating, electroless plating, or other methods.

Figure 2F:
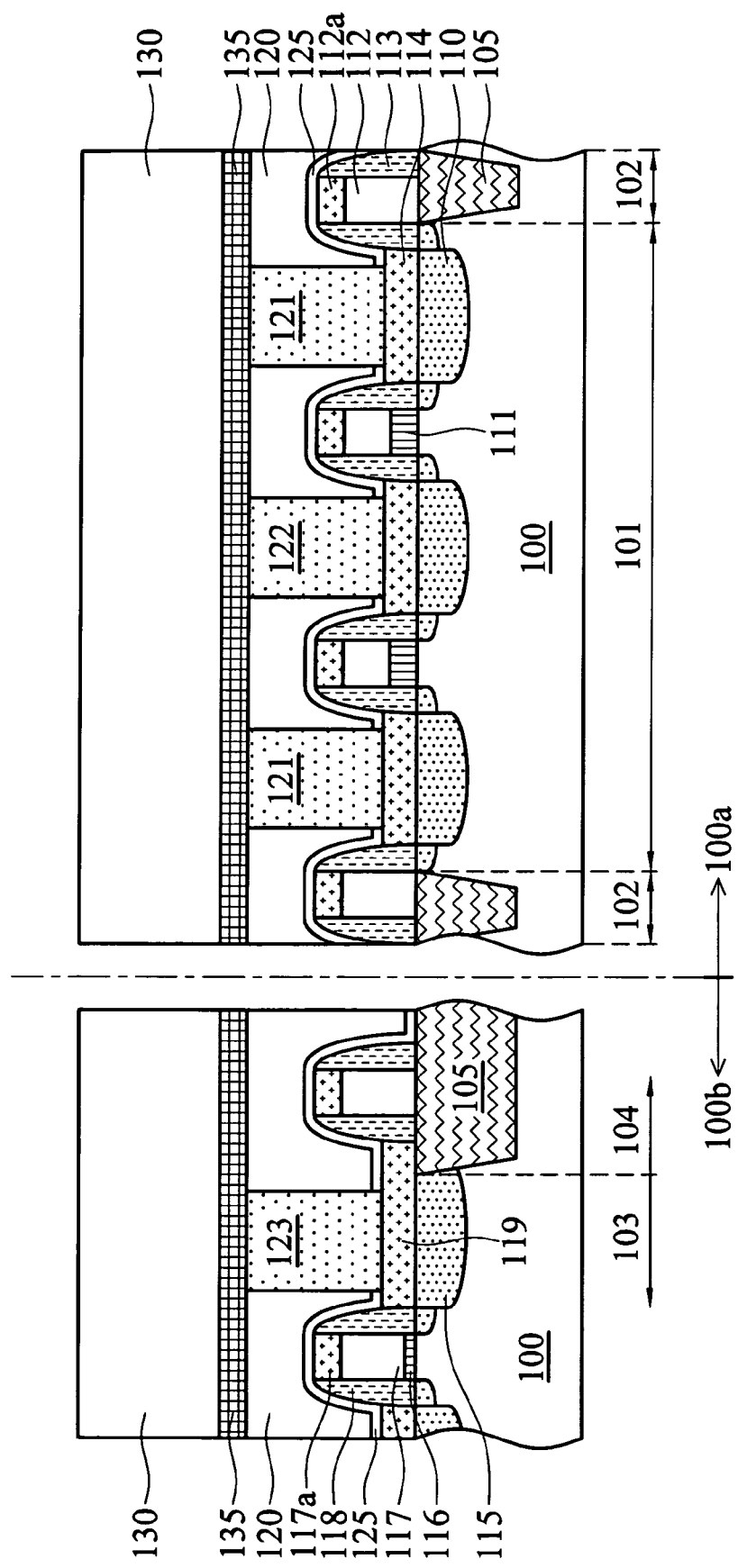

In FIG. 2F, the second dielectric layer 130 is formed overlying the first dielectric layer 120, and is preferably followed by a planarization step utilizing CMP or other techniques to planarize the second dielectric layer 130. The second dielectric layer 130 can be formed by CVD (such as HDPCVD, PECVD, APCVD, or other known CVD methods), spin-coating, or other methods. In this embodiment, the second dielectric layer 130 optionally comprises an underlying etch stop layer 135.

Figure 2G:
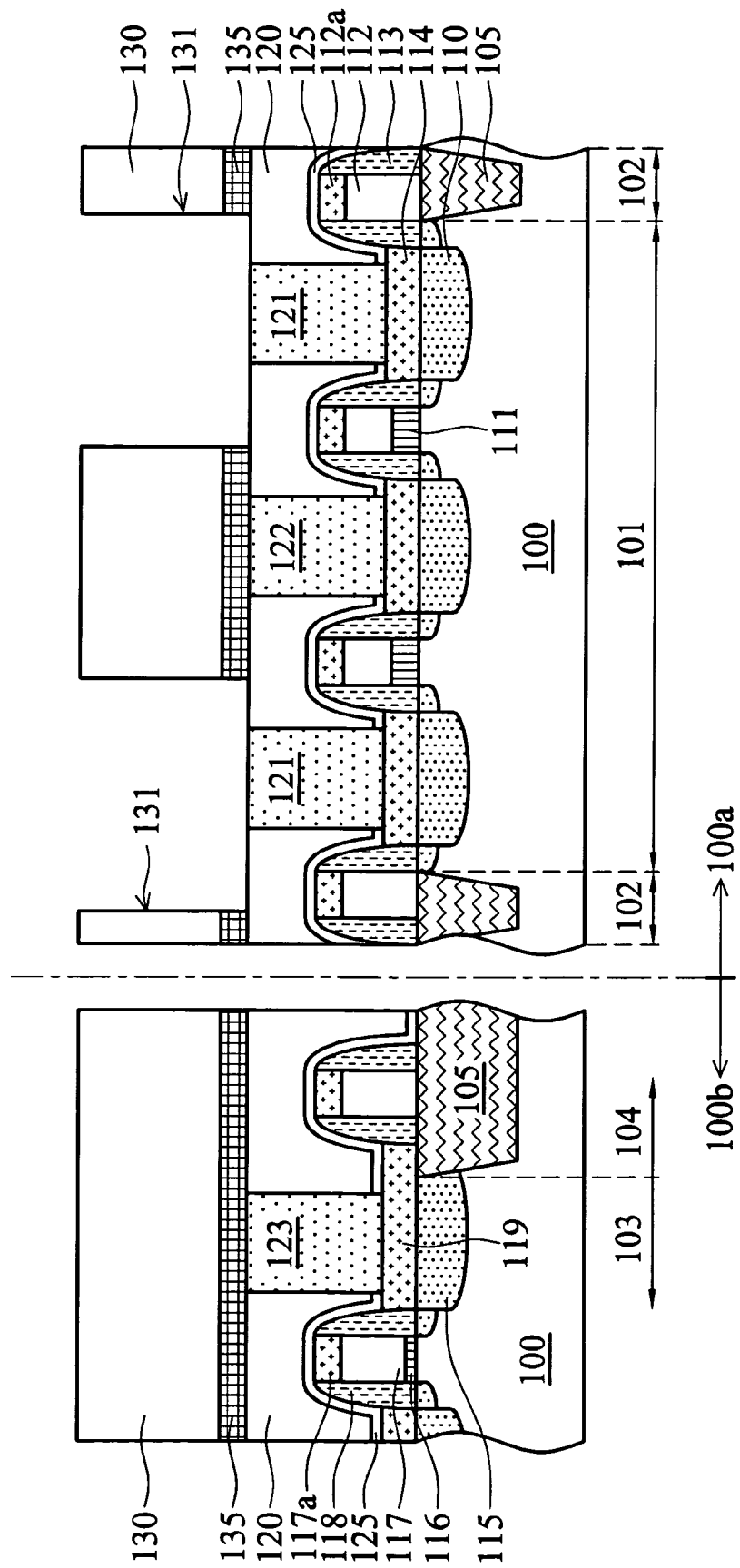

In FIG. 2G, the second dielectric layer 130 is patterned to form a plurality of capacitor openings 131 therein. The capacitor openings 131 expose the conductive plugs 121. A first patterned mask layer (not shown) can be formed on the second dielectric layer 130, for example, exposing parts of the second dielectric layer 130, followed by etching the exposed second dielectric layer 130 utilizing the first patterned mask layer as an etch mask to form the capacitor openings 131. The first patterned mask layer is then removed when formation of the capactor openings 131 is complete.

Figure 2H:
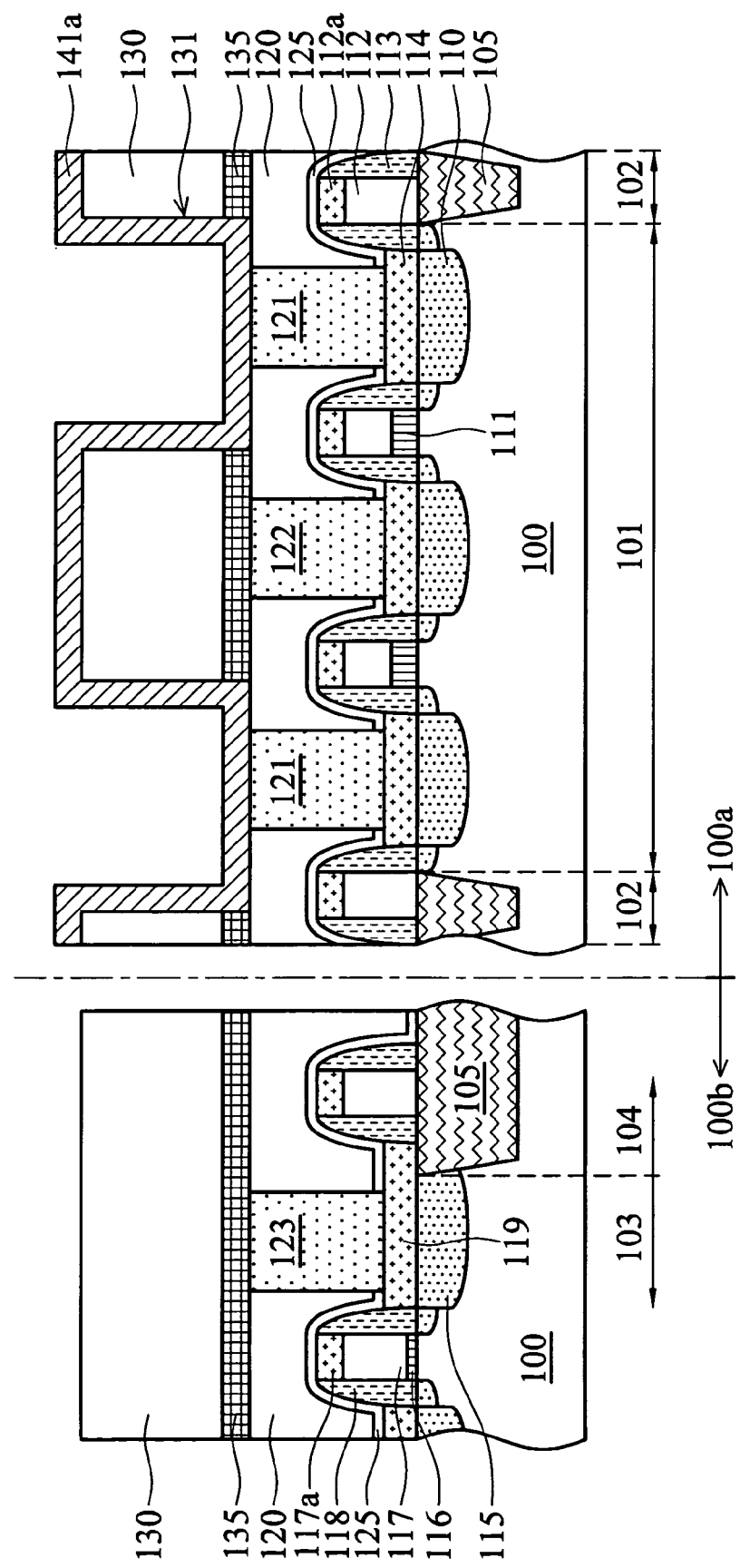

In FIG. 2H, a bottom plate layer 141a is conformally formed overlying the patterned second dielectric layer 130. The bottom plate layer 141a can be formed by CVD (such as MOCVD), ALD or other methods. The bottom plate layer 141a is preferably formed at 450° C. or below to prevent changing or deviating properties of the underlying transistors. For example, the S/D regions 110 and 115 may potentially diffuse when subsequent processing temperature rises. The diffusion of the S/D regions 110 and 115 substantially deviates the electrical performance of the transistors when processing temperature rises to 450° C. or above. In some cases, the bottom plate layer 141a is optionally annealed immediately after the formation thereof for improving mechanical and electrical properties.

Figure 2I:
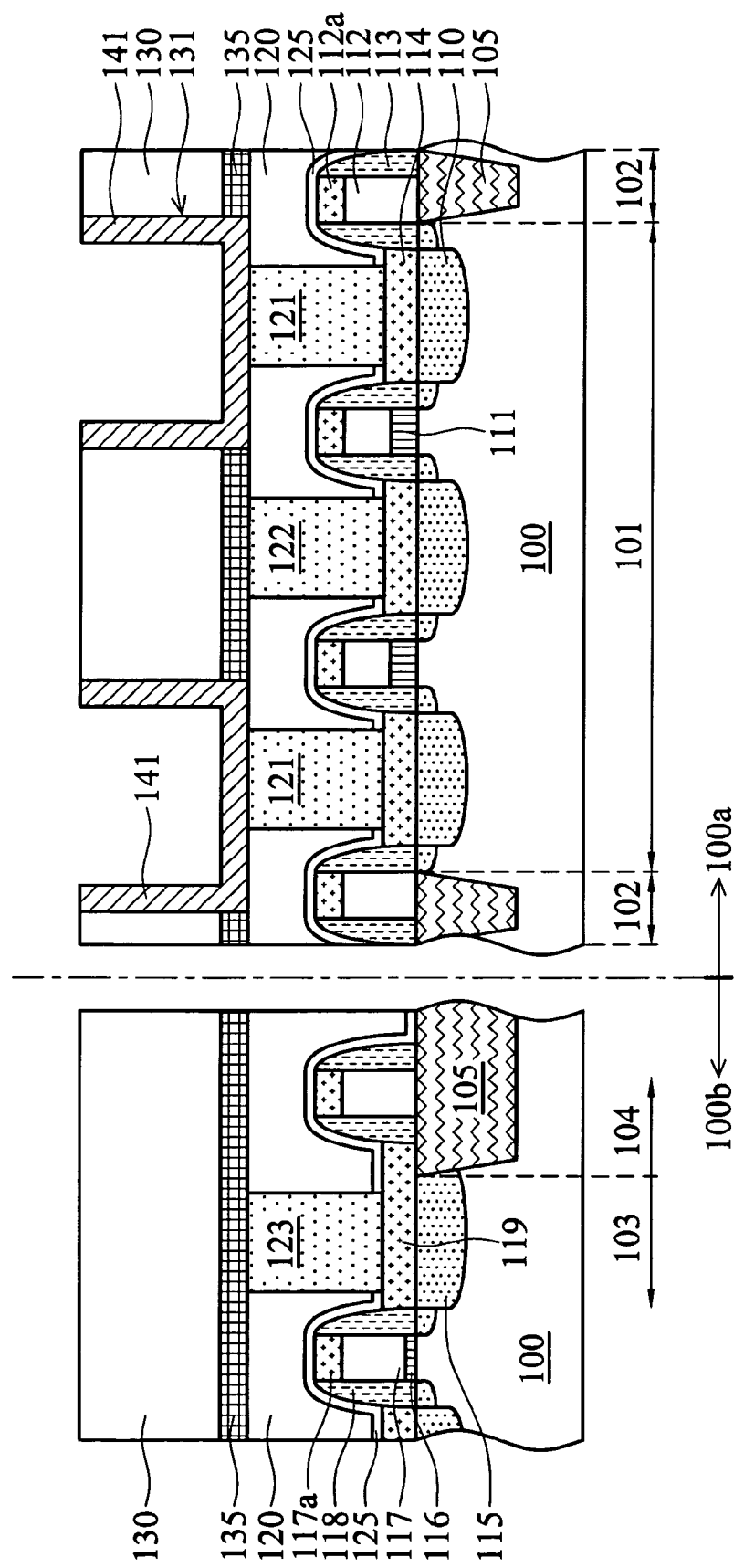

In FIG. 2I, the bottom plate layer 141a beyond the capacitor openings 131 is removed, leaving a plurality of isolated bottom plates 141 in the capacitor openings 131 and exposing parts of the second dielectric layer 130. The unwanted bottom plate layer 141a can be removed by CMP, etching back, or other methods without mask layers to self-aligned the remaining bottom plates 141 in the capacitor openings 131, and thus, no mask is utilized for formation of the bottom plates 141, reducing process cost and duration, and improving product throughput.

Figure 2J:
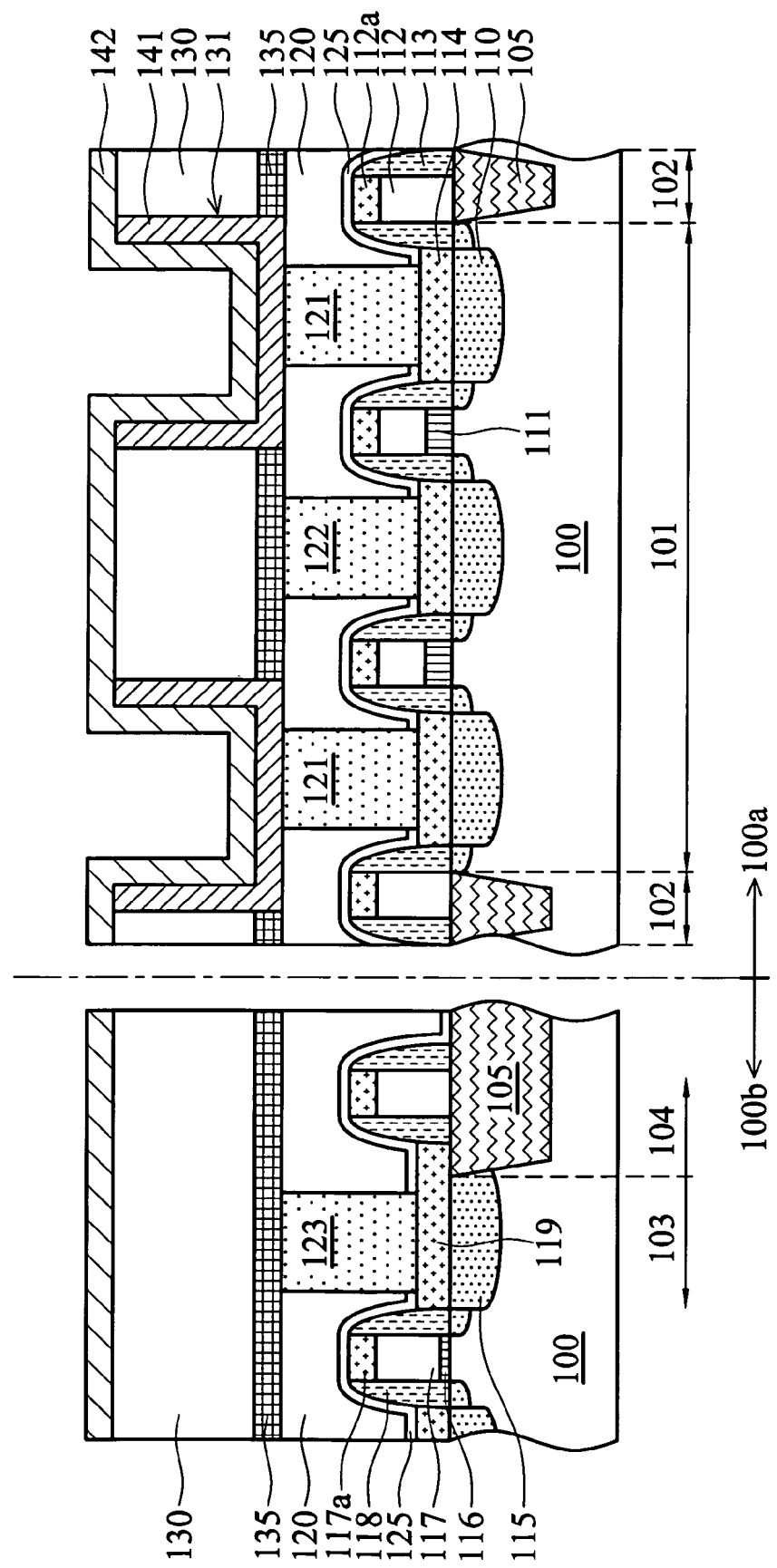

In FIG. 2J, the capacitor dielectric layer 142, comprising known high-k dielectrics, is conformally formed overlying the exposed second dielectric layer 130 and the bottom plates 141. The capacitor dielectric layer 142 is formed by CVD, ALD or other methods. The capacitor dielectric layer 142 is preferably formed at 450° C. or below due to the described reasons. In some cases, the capacitor dielectric layer 142 is optionally annealed immediately after the formation thereof for improving mechanical and electrical properties.

In some cases, the capacitor dielectric layer 142 is single-layered, and comprises hafnium oxide, aluminum oxide, or other known high-k dielectrics. In some cases, the capacitor dielectric layer 142 is multi-layered comprising two or more sub-layers such as a stack of TiTaO/hafnium oxide/tantalum oxide or other known high-k dielectrics.

Figure 2K:
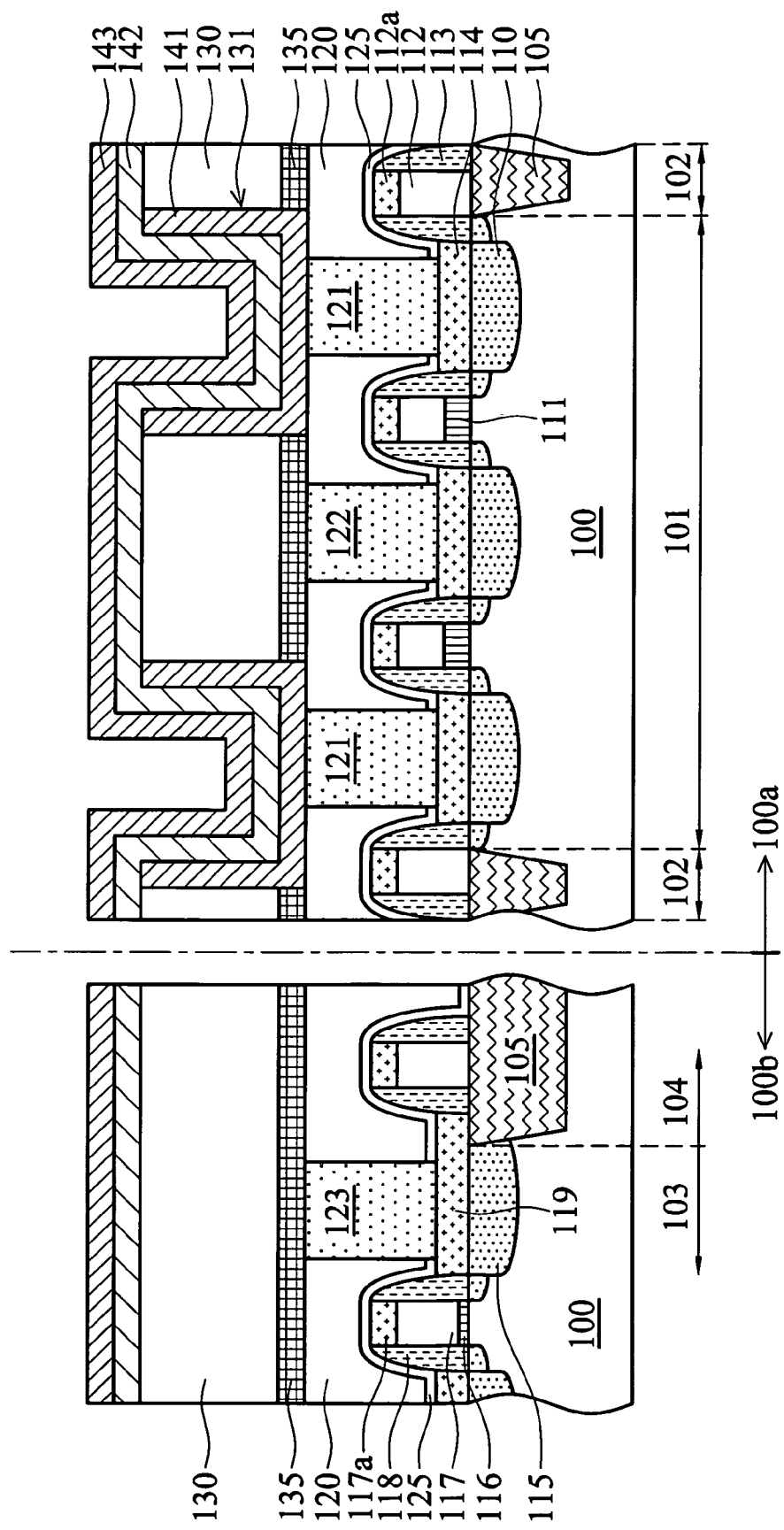

In FIG. 2K, the top plate 143 is conformally formed overlying the capacitor dielectric layer 142. The top plate 143 is formed by CVD (such as MOCVD), ALD or other methods. The top plate 143 is preferably formed at 450° C. or below due to the described reasons. Further, the top plate 143 may be optionally annealed immediately after the formation thereof for improving mechanical and electrical properties. In some cases, the bottom plates 141, the capacitor dielectric layer 142, and the top plate 143 are simultaneously annealed by this annealing step.

The capacitor dielectric layer 142 and top plate 143 are then patterned, forming the top plate opening 143a exposing parts of the second dielectric layer 130 in the memory region 100a as shown in FIG. 1A. In this embodiment, the capacitor dielectric layer 142 and top plate 143 in the periphery region 100b are simultaneously removed during this patterning step. In some cases, the capacitor dielectric layer 142 and top plate 143 in the periphery region 100b may be previously or subsequently removed. In some cases, the top plate 143 in the periphery region 100b is completely removed while the underlying capacitor dielectric layer 142 is not removed or incompletely removed, preventing damage to the underlying dielectric layer 130. In some cases, the capacitor dielectric layer 142 is remained in the top plate opening 143a, preventing damage to the underlying dielectric layer 130. In this embodiment, a second patterned mask layer (not shown) is formed on the top plate 143, for example, exposing the unwanted parts of the capacitor dielectric layer 142 and top plate 143, followed by etching the exposed top plate 143 and capacitor dielectric layer 142 utilizing the second patterned mask layer as an etch mask to complete the patterning of the top plate 143 and capacitor dielectric layer 142. The second patterned mask layer is then removed.

In this embodiment, only two masks (the described first and second masks) are required for formation of the capacitors, reducing process cost and improving throughput.

Further, the subsequent additional steps may be performed to form the embedded memory shown in FIG. 1C.

Figure 2L:
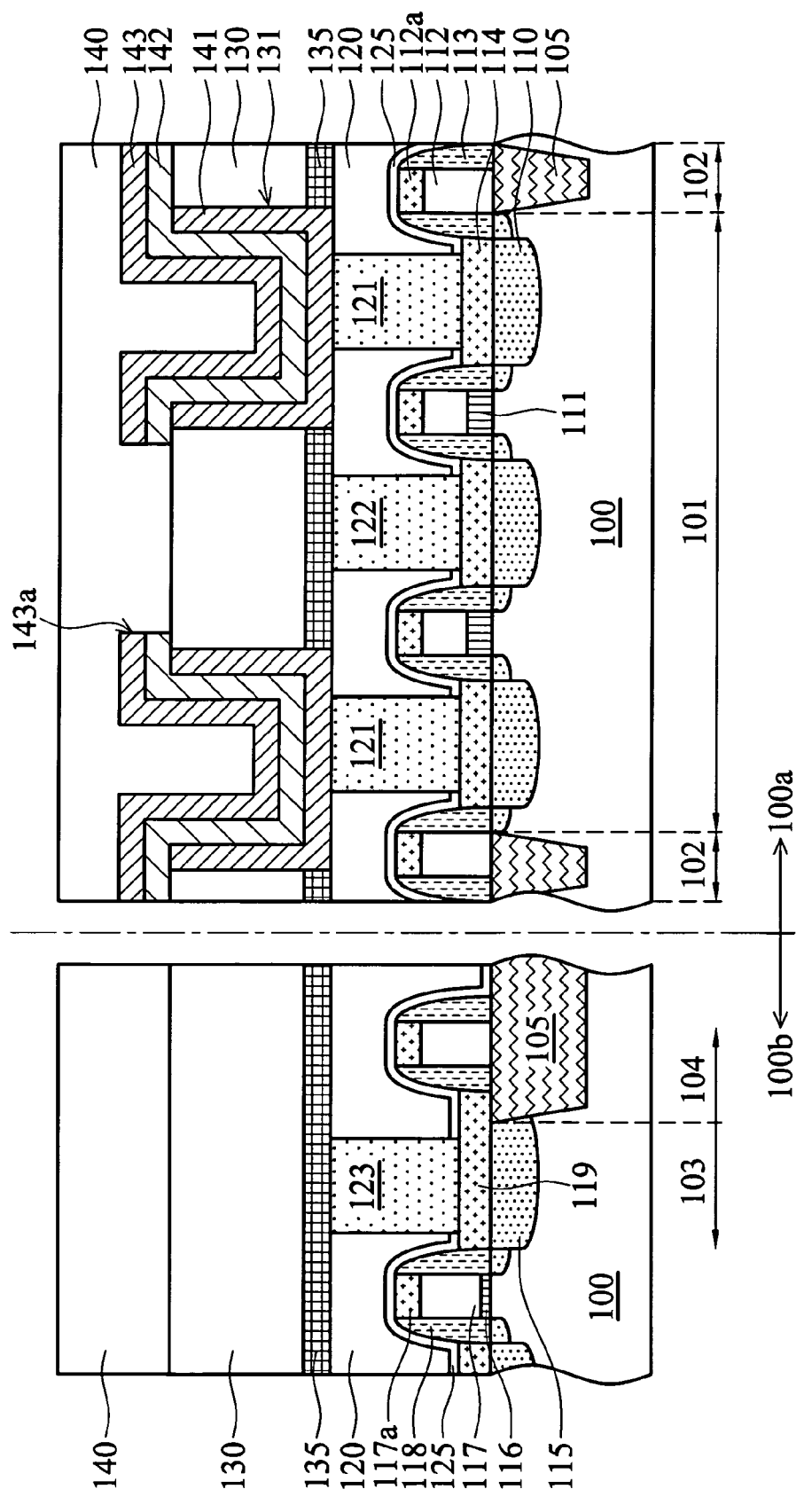

In FIG. 2L, the third dielectric layer 140 is formed overlying the top plate 143 and the exposed second dielectric layer 130, and is preferably followed by a planarization step utilizing CMP or other techniques to planarize the third dielectric layer 140. The third dielectric layer 140 can be formed by CVD (such as HDPCVD, PECVD, APCVD, or other known CVD methods), spin-coating, or other methods.

Figure 2M:
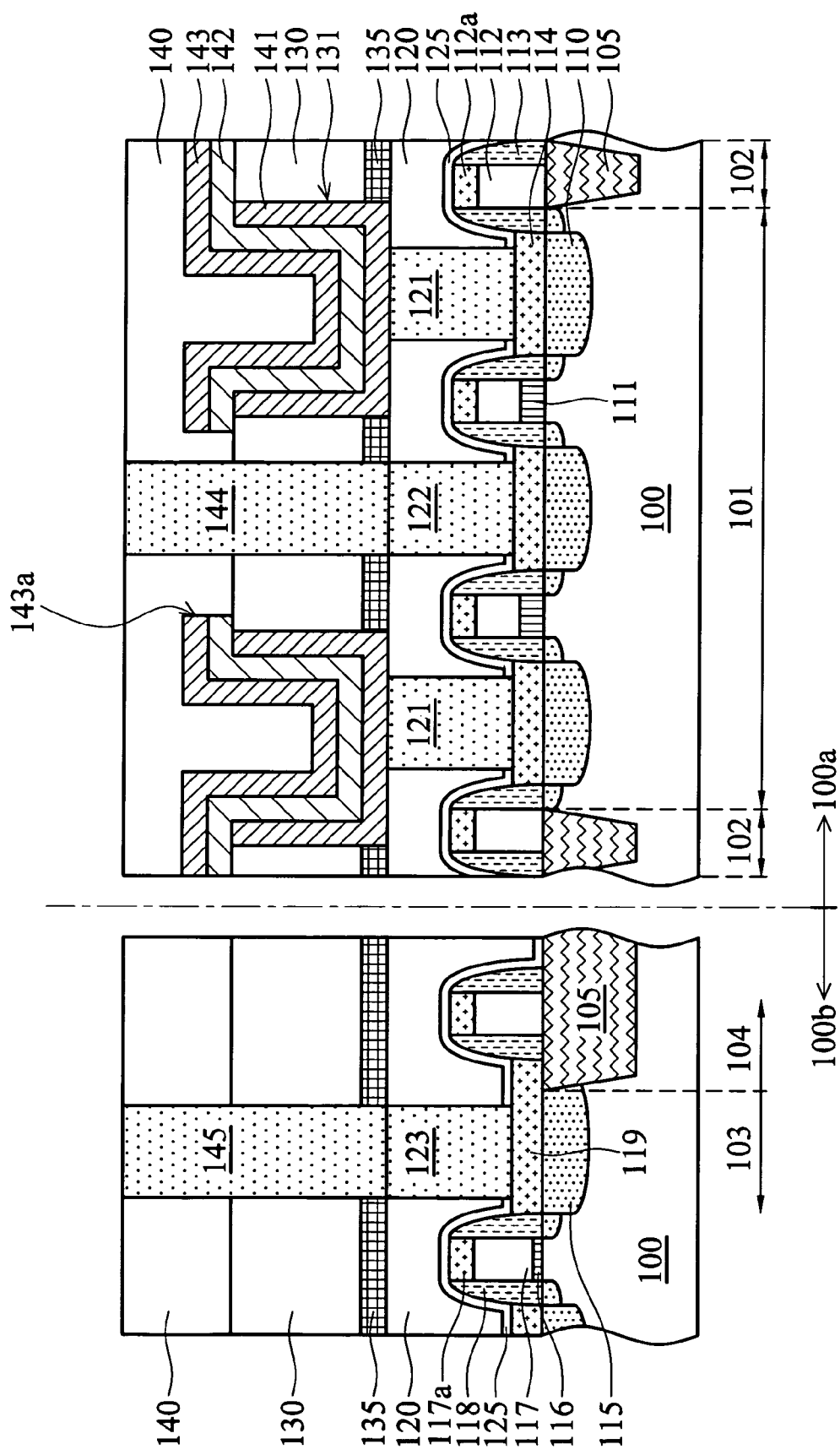

In FIG. 2M, the conductive plug 144 is embedded in the third dielectric layer 140 and the second dielectric layer 130, electrically connecting the conductive plug 122. In some cases, the conductive plug 145 may be simultaneously embedded in the third dielectric layer 140 and the second dielectric layer 130, electrically connecting the conductive plug 123. For example, the third dielectric layer 140 and the inter-layer dielectric layer 130 can be patterned to form a plurality of openings exposing the underlying conductive plugs 122 and 123, followed by filling conductive materials in the openings to form the conductive plugs 144 and 145. The conductive materials can be filled by CVD, PVD, electroplating, electroless plating, or other methods, preferably followed by a planarization step utilizing CMP or other techniques.

Finally, the metal layer 150 is formed overlying the third dielectric layer 140 and the conductive plugs 144 and 145 as shown in FIG. 1C.

FIGS. 3A through 3D are cross-sections of a fabrication method of the embedded memory shown in FIG. 1D.

Figure 3A:
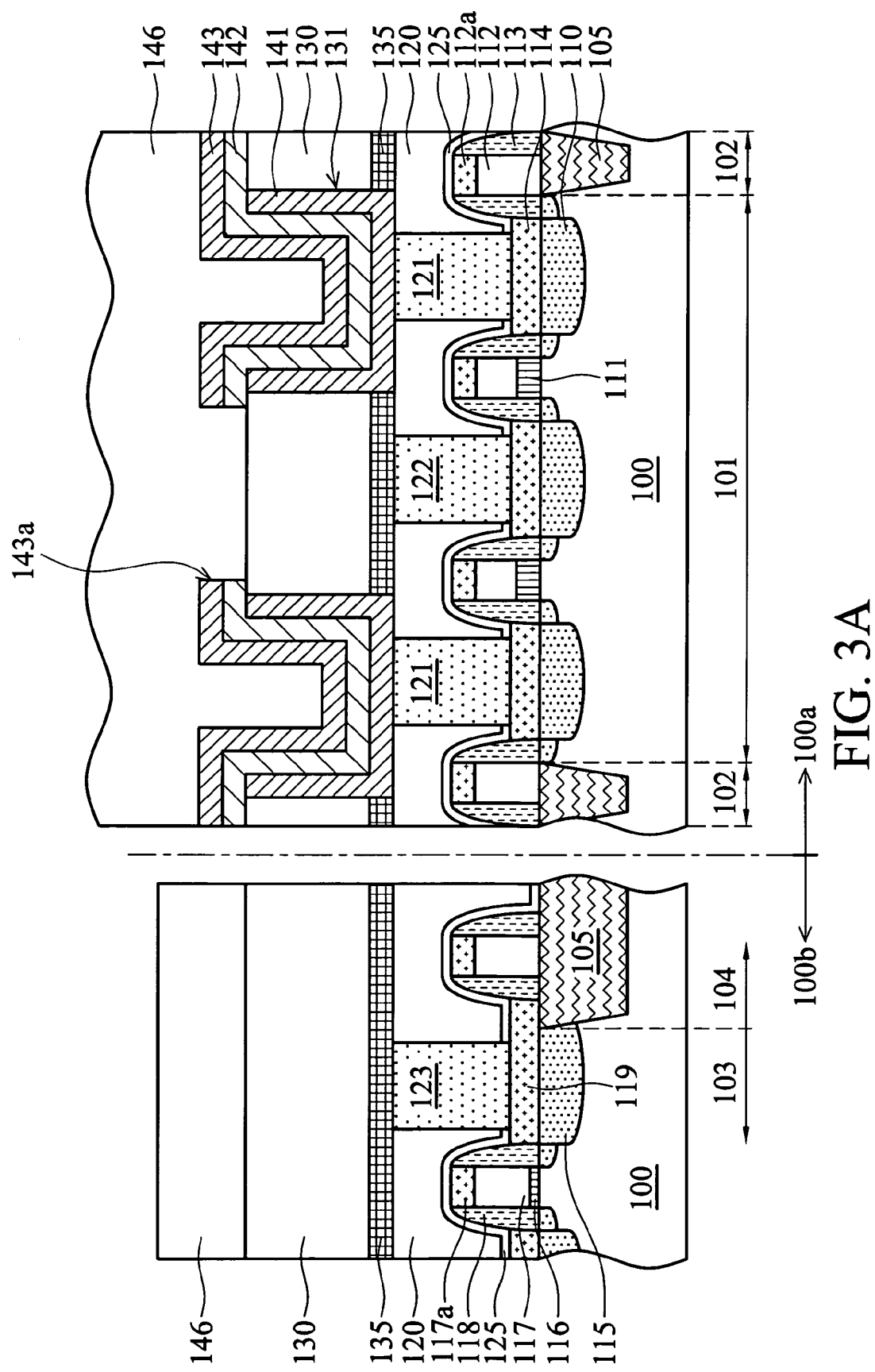
FIGS. 3A through 3D are cross-sections of alternative fabrication methods of embedded memories of the invention.
Figure 3B:
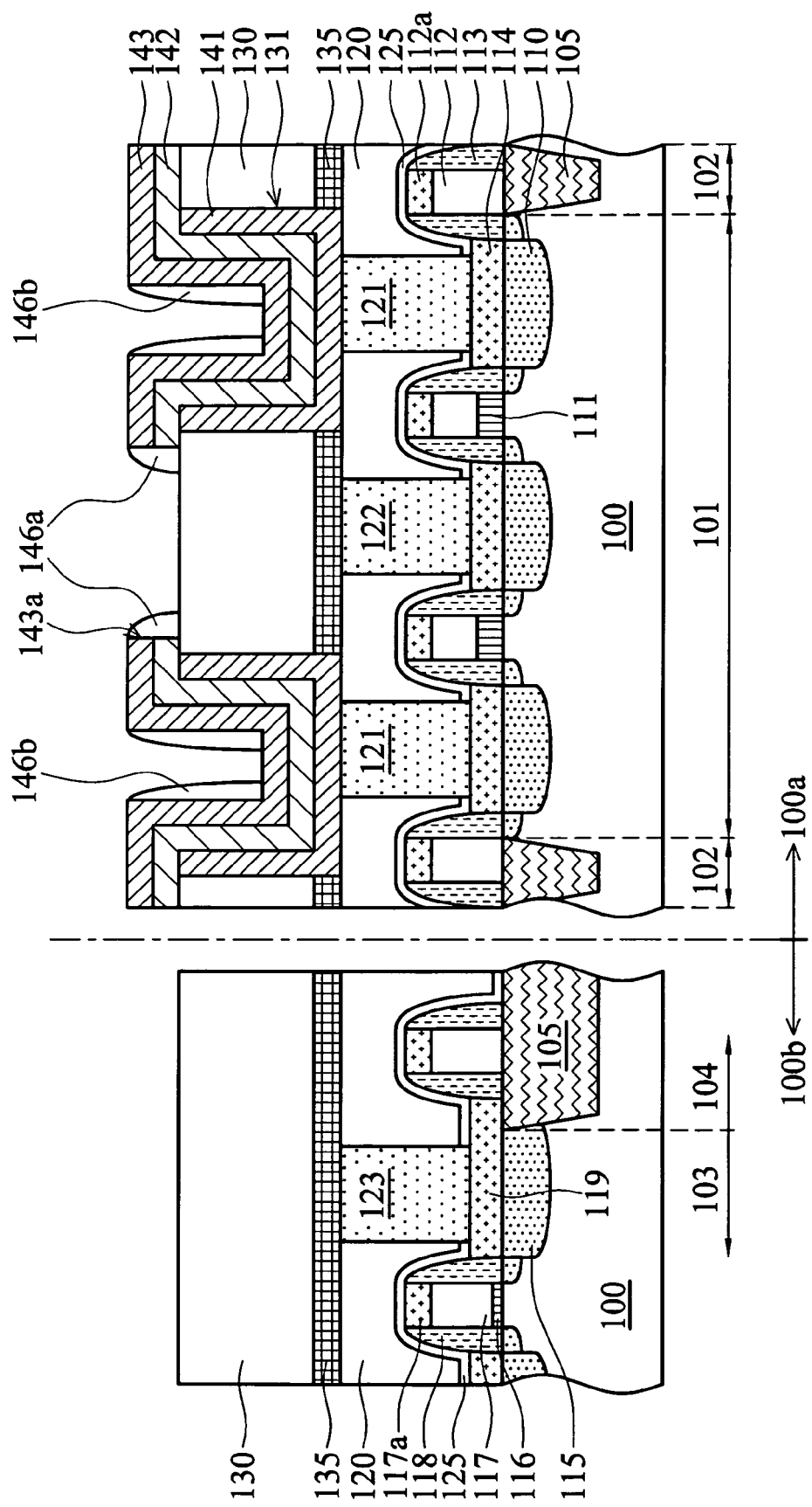

After the embedded memory shown in FIG. 1A is completed, a dielectric layer 146 is blanketly formed overlying the inter-layer dielectric layer 130 and capacitors of the invention as shown in FIG. 3A. In FIG. 3B, the dielectric layer 146 is isotropically etched, remaining the dielectric spacer 146a on a sidewall of the top plate 143. In some cases, the dielectric layer 146 may be partially remained on the top plate 143 in a sidewall of opening 131, acting as a dielectric spacer 146b.

Figure 3C:
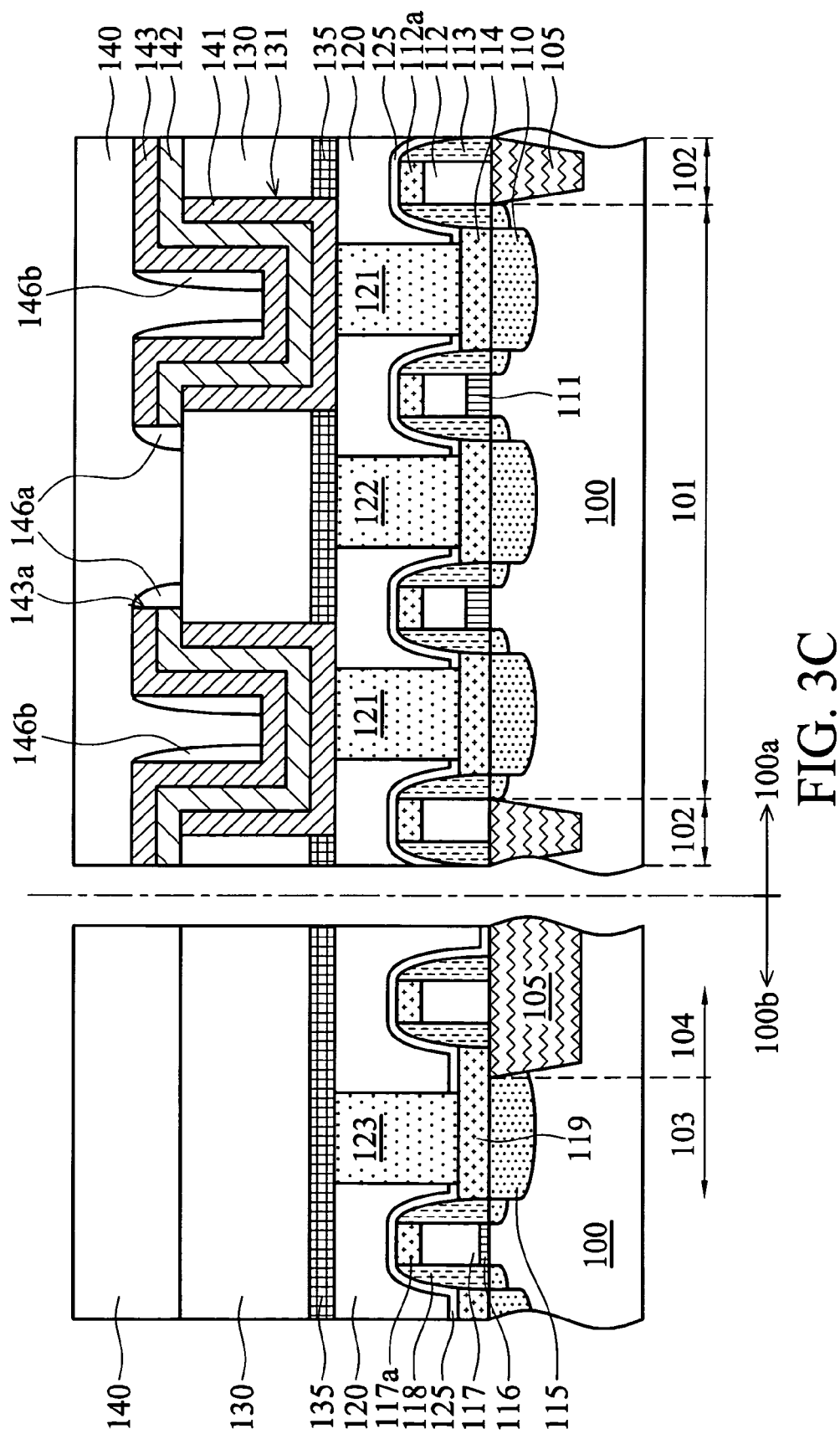

In FIG. 3C, the third dielectric layer 140 is formed overlying the top plate 143, the exposed second dielectric layer 130, the dielectric spacer 146a, and the potentially remaining dielectric spacer 146b. Details regarding formation of the third dielectric layer 140 are the same as the descriptions for that shown in FIG. 2L, and thus, are omitted herefrom.

Figure 3D:
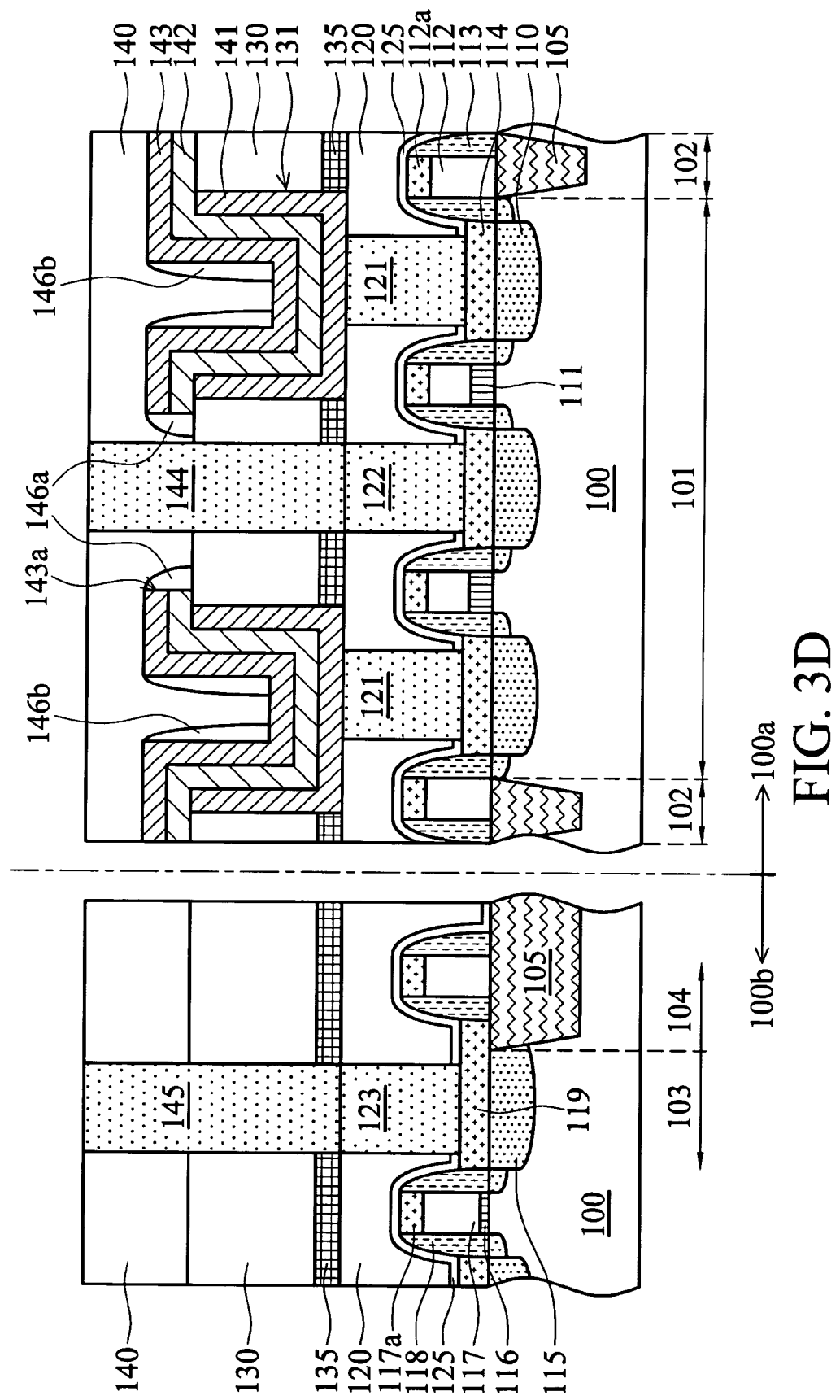

In FIG. 3D, the conductive plug 144 is embedded in the third dielectric layer 140 and the second dielectric layer 130, electrically connecting the conductive plug 122. In some cases, the conductive plug 145 may be simultaneously embedded in the third dielectric layer 140 and the second dielectric layer 130, electrically connecting the conductive plug 123. Details regarding formation of the conductive plugs 144 and 145 are the same as the descriptions for that shown in FIG. 2L, and thus, are omitted herefrom. Finally, the metal layer 150 is formed overlying the third dielectric layer 140 and the conductive plugs 144 and 145 as shown in FIG. 1D.

When the capacitor pitch shown in FIGS. 2M and 3D reduces as increase of the device integrity of the embedded memories, the occurrence of unwanted contact between the conductive plug 144 and the top plate 143 due to process deviation potentially increases. Formation of the dielectric spacer 146a between the conductive plug 144 and the top plate 143, preferably on at least one sidewall of the top plate 143, provides the solution. The dielectric spacer 146a preferably has higher etch resistance to an etchant than the third dielectric layer 140 and the inter-layer dielectric layer 130. Thus, the dielectric spacer 146a can effectively protect the corresponding top plate 143 from exposure during the patterning of the third dielectric layer 140 and the inter-layer dielectric layer 130 even if the process deviation occurs. As described, the dielectric spacer 146a successfully prevents unwanted contact between the conductive plug 144 and the top plate 143, enabling size reduction and integrity increase of the inventive memory devices.

Figure 5:
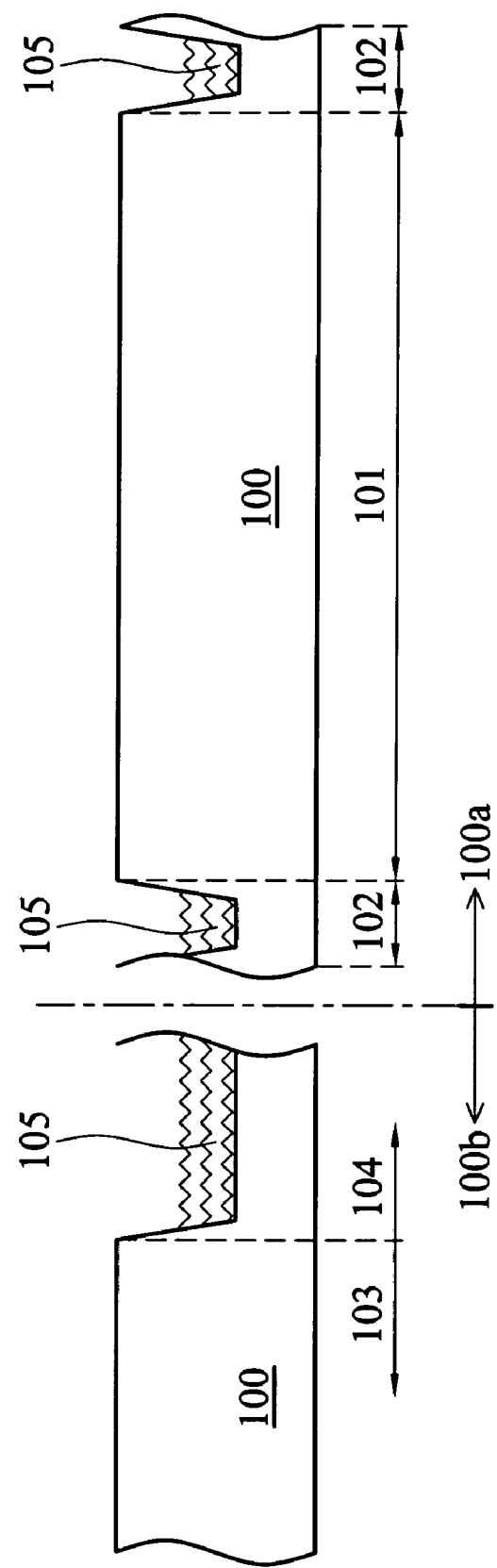
FIG. 5 is a cross-section of a modified embodiment of embedded memories of the invention.

In some cases, an optional step can be performed after formation of the isolation structure 105. The isolation structure 105 is recessed by etching, for example, as shown in FIG. 5. When the embedded memories shown in FIGS. 1A, 1C, and 1D comprise the recessed isolation structure 105, they gain the advantages described in the following.

Figure 7A:
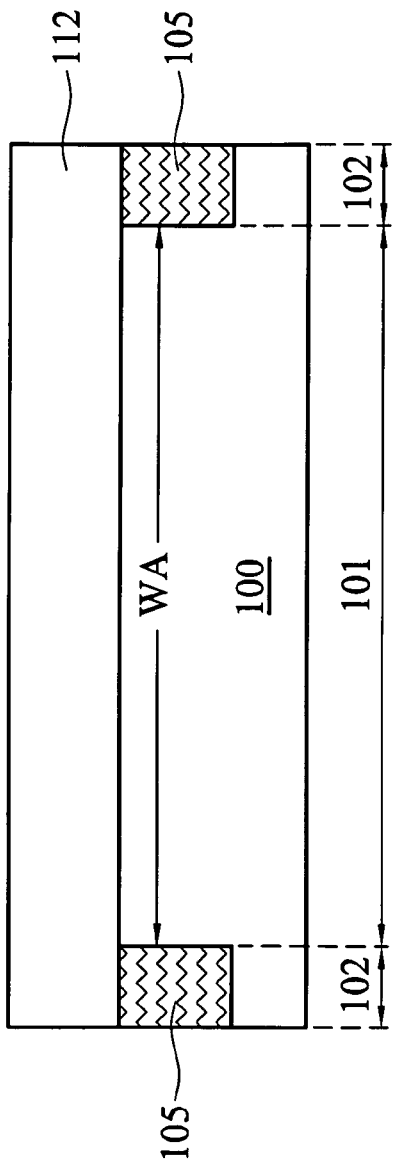
Figure 7B:
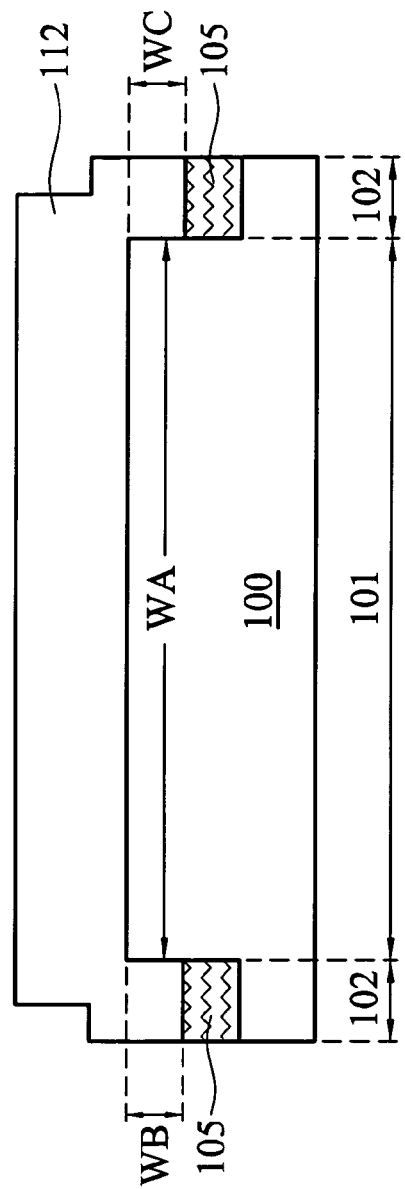

FIG. 6 is a top view, showing the gate electrodes 112 and 117 formed overlying the substrate 100. Cross-sections along line CC are shown in FIGS. 7A and 7B. In FIG. 7A, the isolation structure 105 is not recessed, and the effective transistor width is WA. In FIG. 7B, the isolation structure 105 in the cell array region 100a is recessed, and the effective transistor width is (WA+WB+WC), an increase of (WB+WC) due to recession of the isolation structure 105. The current between source and drain is proportional to transistor width during operation of the first transistors, and thus, recession of the isolation structure 105 in the cell array region 10a can be utilized for control of the performance of the first transistors. Similarly, recession of the isolation structure 105 in the periphery region 100b can be utilized for control of the performance of the second transistors, and details regarding thereto are the same as the descriptions for FIG. 7B, and thus, are omitted herefrom. The recession can be performed on the isolation structure 105 in both or one of the regions 100a and 100b as desired without any masking steps.

As described, in this embodiment, the gate dielectric layer 111 is thicker than the gate dielectric layer 116. FIGS. 8A through 8E show an exemplary flow for formation of the gate dielectric layer 111 and the gate dielectric layer 116 during formation of the first and second transistors.

Figure 8A:
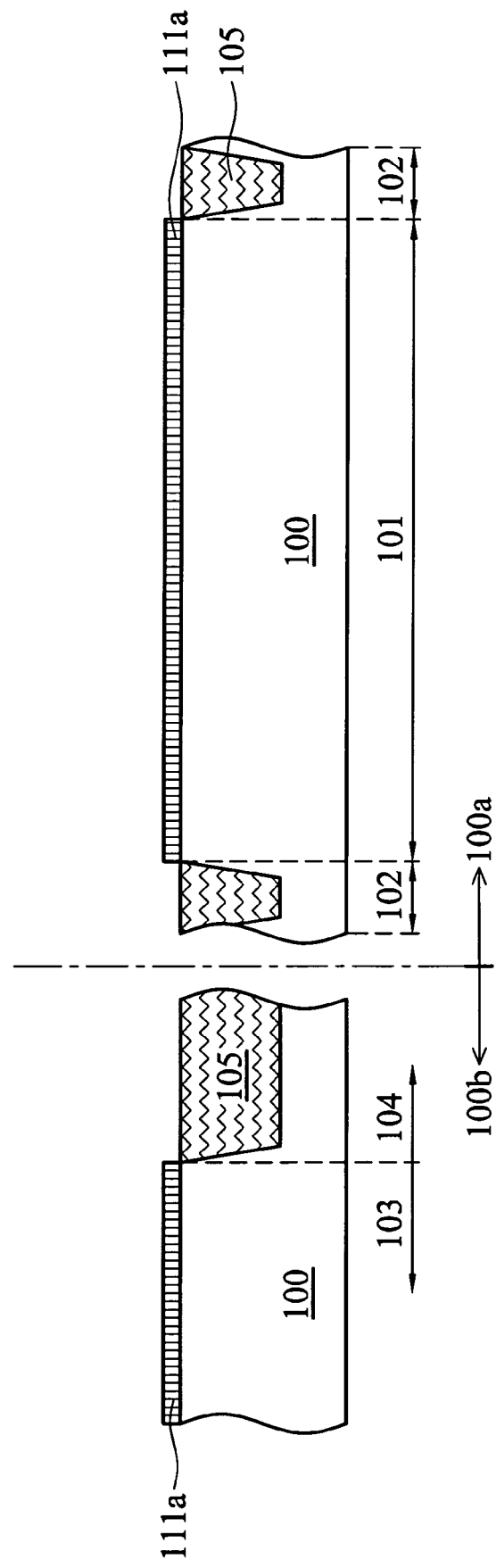
FIGS. 8A through 8E are cross-sections of fabrication methods of a semiconductor device of the invention.

In FIG. 8A, following that shown in FIG. 2B, a first insulating layer 111a is formed overlying the active areas 101 and 103 by a method such as thermal oxidation. The first insulating layer 111a overlying the isolation structure 105 is too thin to be shown due to less material of the substrate 100 diffusing to the surface of the isolation structure 105 to be oxidized. In some cases, the first insulating layer 111a comprises nitrides, nitrified oxides, or known high-k (dielectric constant) dielectrics (such as hafnium oxide or other high-k dielectrics), and is formed by at least one of known CVD methods.

Figure 8B:
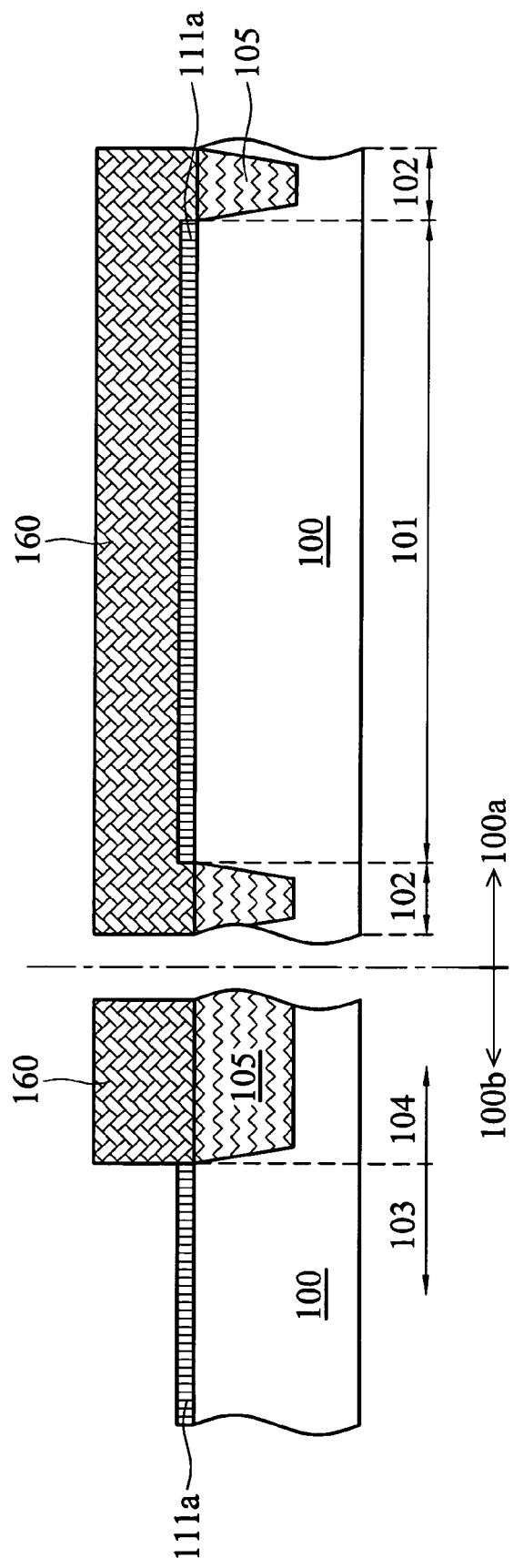
Figure 8C:
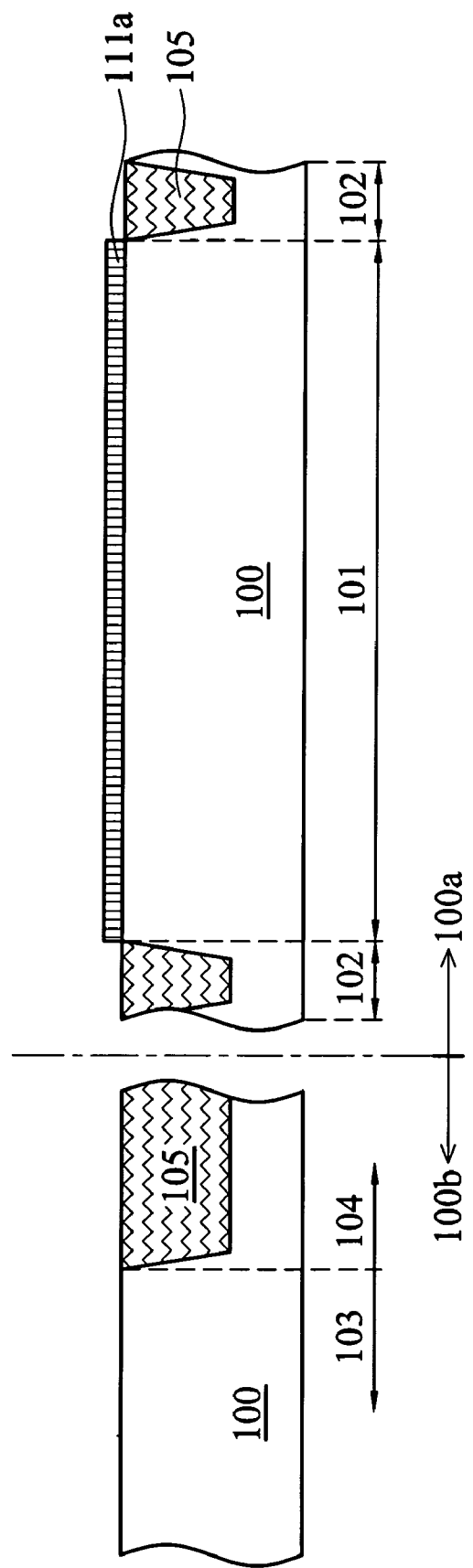

In FIG. 8B, a patterned mask layer 160 is formed overlying the substrate 100, exposing the first insulating layer 111a overlying the second active region 103. In FIG. 8C, the exposed first insulating layer 111a is removed, followed by removing the patterned mask layer 160.

Figure 8D:
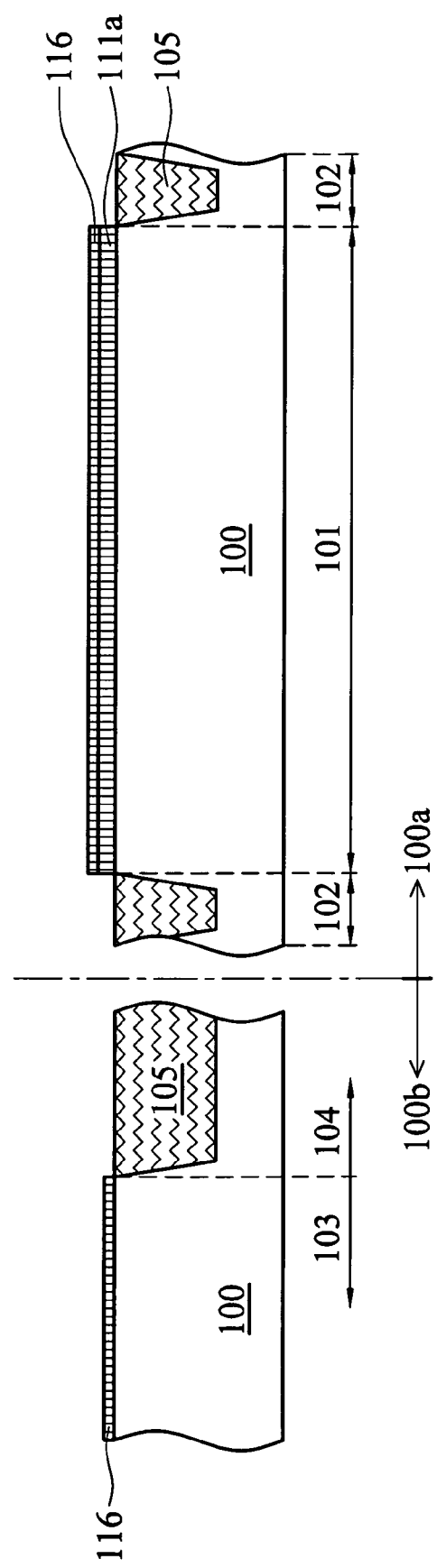

In FIG. 8D, a second insulating layer 116 is formed overlying the active areas 101 and 103 by a method such as thermal oxidation. The second insulating layer 116 overlying the isolation structure 105 is too thin to be shown due to the described reason. The second insulating layer 116 overlying the second active region 103 acts as the gate dielectric for the second transistors. The second insulating layer 116 overlying the first active areas 101 is potentially thinner than that overlying the second active region 103 due to the underlying first insulating layer 111a blocking diffusion of materials of the substrate 100. In some cases, the second insulating layer 116 comprises nitrides, nitrified oxides, or known high-k (dielectric constant) dielectrics (such as hafnium oxide or other high-k dielectrics), and is formed by at least one of known CVD methods.

Figure 8E:
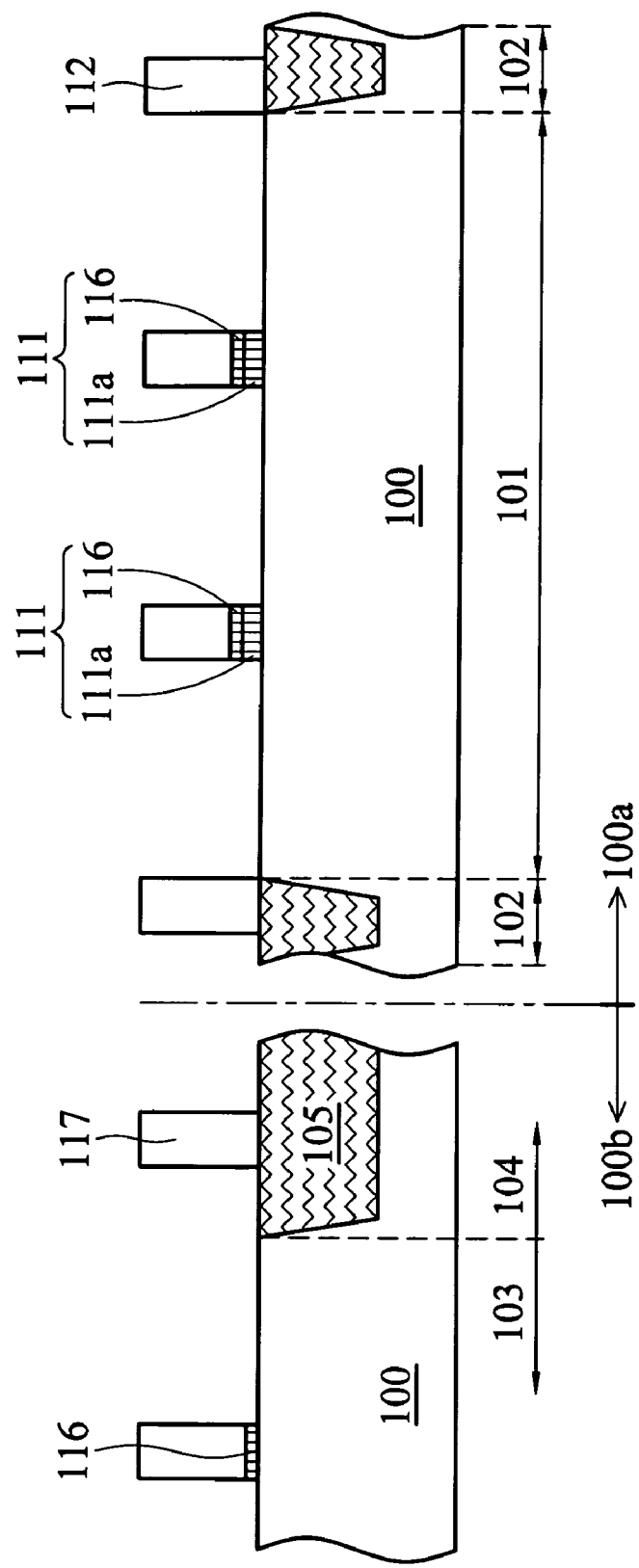

In FIG. 8E, a conductive gate layer is formed overlying the substrate 100, followed by patterning the conductive gate layer and the underlying insulating layers 111a and 116 to form the gate electrodes 112, 117 and the gate dielectric layers 111, 116. The patterned first and second insulating layers 111a and 116 overlying the first active region 101 act as the gate dielectric layer 111, and the patterned second insulating layer 116 overlying the second active region 103 acts as the gate dielectric layer 116.

The efficacy of the inventive semiconductor devices at requiring less mask layers, provides reduced process cost, improved throughput, and higher speed performance of the memory device.

While the invention has been described by way of example and in terms of preferred embodiment, it is to be understood that the invention is not limited thereto. It is therefore intended that the following claims be interpreted as covering all such alteration and modifications as fall within the true spirit and scope of the invention.

What is claimed is:

1. A fabrication method of an embedded memory, comprising:
   providing a substrate comprising a cell array region and a periphery region;
   forming an isolation structure in contact with and in the substrate to divide the cell array region into a plurality of first active areas isolated by a first isolation area and divide the periphery region into a plurality of second active areas isolated by a second isolation area;
   recessing the isolation structure in the first isolation area, such that a top surface of the isolation structure in the first isolation area is lower than a top surface of the substrate;
   forming a plurality of first transistors in the first active area and a plurality of second transistors in the second active region;
   forming a first dielectric layer overlying the first and second transistors;
   embedding first and second conductive plugs, electrically connecting the first transistors, into the first dielectric layer;
   forming an etch stop layer and a second dielectric layer overlying the first dielectric layer, wherein the etch stop layer is in contact with the first dielectric layer and directly below the second dielectric layer;
   patterning the second dielectric layer and the etch stop layer to form a plurality of capacitor openings therein, exposing the first conductive plugs;

conformally forming a first plate layer overlying the second dielectric layer and laterally surrounding the etch stop layer;

removing the first plate layer beyond each capacitor opening to self align the first plate layer in each capacitor opening;

conformally forming a capacitor dielectric layer overlying the second dielectric layer and the first plate layer in each capacitor opening;

conformally forming a second plate layer overlying the capacitor dielectric layer;

patterning the second plate layer and the capacitor dielectric layer to form a plurality of capacitors corresponding to the plurality of capacitor openings and form a top plate opening exposing the second dielectric layer and being fully surrounded by the patterned second plate layer as viewed from a top-view perspective, wherein the patterned second plate layer is shared by at least two of the plurality of capacitors;

forming a first dielectric spacer on the second plate layer on a sidewall of each capacitor opening dielectric spacer on a sidewall of the top plate opening.

2. The method as claimed in claim 1, wherein formation of the first and second transistors further comprises:

forming a first insulating layer overlying the first and second active areas;

forming a patterned mask layer overlying the substrate, exposing the first insulating layer overlying the second active area;

removing the exposed first insulating layer;

removing the patterned mask layer;

forming a second insulating layer overlying the first and second active areas;

forming a conductive gate layer overlying the substrate; and patterning the conductive gate layer and the first and second insulating layers to form first and second gate electrodes and the underlying first and second gate dielectric layers, wherein the patterned conductive gate layer overlying the first active areas acts as first gate electrodes of the first transistors, the patterned conductive gate layer overlying the second active areas acts as a second gate electrodes of the second transistors, the patterned first and second insulating layers overlying the first active areas act as a first gate dielectric layer, and the patterned second insulating layer overlying the second active areas acts as a second gate dielectric layer thinner than the first gate dielectric layer.

3. The method as claimed in claim 1, wherein formation temperature of the first plate layer is as high as 450° C. or below.

4. The method as claimed in claim 1, wherein formation temperature of the capacitor dielectric layer is as high as 450° C. or below.

5. The method as claimed in claim 1, wherein the device as claimed in claim 1, wherein formation temperature of the second plate layer is as high as 450° C. or below.

6. The method as claimed in claim 1, wherein the first plate layer beyond the capacitor opening is removed by CMP or etching.

7. The method as claimed in claim 1, wherein the isolation structure in the first isolation area is recessed by etching.

8. The method as claimed in claim 1, further comprising forming a silicide layer overlying at least one of the first transistor corresponding to at least one of the first conductive plugs prior to formation of the first dielectric layer.

9. The method as claimed in claim 1, further comprising forming a silicide layer overlying at least one of the first transistor corresponding to at least one of the second conductive plugs prior to formation of the first dielectric layer.

10. The method as claimed in claim 1, further comprising forming silicide layers overlying the first transistors corresponding to at least one of the first conductive plugs and at least one of the second conductive plugs prior to formation of the first dielectric layer.

11. The method as claimed in claim 1, further comprising:

forming a third dielectric layer overlying the top plate and the exposed second dielectric layer;

embedding a third conductive plug in the second and third dielectric layers, electrically connecting the second conductive plug; and forming a metal line overlying the third dielectric layer, electrically connecting the third conductive plug.

12. The method as claimed in claim 11, further comprising:

embedding a fourth conductive plug in the first dielectric layer simultaneously with embedding the first and second conductive plug, electrically connecting the second transistor; and embedding a fifth conductive plug in the second and third dielectric layers simultaneously with embedding the third conductive plug, electrically connecting the fourth conductive plug, wherein the metal line electrically connects the fifth conductive plug.

13. The method as claimed in claim 12, further comprising forming a silicide layer overlying the second transistor prior to formation of the first dielectric layer.

14. The method as claimed in claim 1, further comprising annealing the first plate layer immediately after the formation thereof.

15. The method as claimed in claim 1, further comprising annealing the capacitor dielectric layer immediately after the formation thereof.

16. The method as claimed in claim 1, further comprising annealing the second plate layer immediately after the formation thereof.

17. The method as claimed in claim 1, further comprising annealing the first plate layer, the capacitor dielectric layer, and the second plate layer after the formation of the second plate layer.

18. The method as claimed in claim 17, further comprising:

embedding a fourth conductive plug in the first dielectric layer simultaneously with embedding the first and second conductive plug, electrically connecting the second transistor; and embedding a fifth conductive plug in the second and third dielectric layers simultaneously with embedding the third conductive plug, electrically connecting the fourth conductive plug, wherein the metal line electrically connects the fifth conductive plug.

19. The method as claimed in claim 18, further comprising forming a silicide layer overlying the second transistor prior to formation of the first dielectric layer.

20. The method as claimed in claim 1, wherein the formation of the first and second dielectric spacers further comprises:

forming a spacer dielectric layer overlying the top plate and the exposed second dielectric layer; and isotropically etching the spacer dielectric layer, remaining the first dielectric spacer on the second plate layer on a sidewall of each capacitor opening and a second dielectric spacer on a sidewall of the top plate opening.

21. The method as claimed in claim 20, further comprising:
forming a third dielectric layer overlying the top plate, the exposed second dielectric layer, and the first and second dielectric spacers;
embedding a third conductive plug in the second and third dielectric layers, electrically connecting the second conductive plug; and
forming a metal line overlying the third dielectric layer, electrically connecting the third conductive plug.

22. The method as claimed in claim 21, further comprising:
embedding a fourth conductive plug in the first dielectric layer simultaneously with embedding the first and second conductive plug, electrically connecting the second transistor; and
embedding a fifth conductive plug in the second and third dielectric layers simultaneously with embedding the third conductive plug, electrically connecting the fourth conductive plug, wherein the metal line electrically connects the fifth conductive plug.

23. The method as claimed in claim 20, wherein the recessing step includes recessing the isolation structure in contact with a sidewall of the substrate such that a top surface of the isolation structure at the sidewall of the substrate is lower than a top surface of the sidewall of the substrate, and wherein the isolation structure is surrounded by the sidewall of the substrate.

* * * * *